(12) United States Patent
Brendel

(10) Patent No.: US 6,645,833 B2
(45) Date of Patent: *Nov. 11, 2003

(54) METHOD FOR PRODUCING LAYERED STRUCTURES ON A SUBSTRATE, SUBSTRATE AND SEMICONDUCTOR COMPONENTS PRODUCED ACCORDING TO SAID METHOD

(75) Inventor: Rolf Brendel, Erlangen (DE)

(73) Assignee: Max-Planck-Gesellschaft zur Foerderung der Wissenschaften e. V., Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/447,000
(22) PCT Filed: Jun. 30, 1998
(86) PCT No.: PCT/EP98/03992
§ 371 (c)(1), (2), (4) Date: Apr. 7, 2000
(87) PCT Pub. No.: WO99/01893
PCT Pub. Date: Jan. 14, 1999

(65) Prior Publication Data
US 2003/0017712 A1 Jan. 23, 2003

(30) Foreign Application Priority Data
Jun. 30, 1997 (DE) .......................... 197 27 791
Jul. 18, 1997 (DE) .......................... 197 30 975
Dec. 31, 1997 (DE) .......................... 197 58 300

(51) Int. Cl.$^7$ .......................... H01L 21/30; H01L 21/46
(52) U.S. Cl. .......................... 438/458; 438/406; 438/409; 438/455; 438/456
(58) Field of Search .......................... 438/409, 960, 438/531, 977, 149, 406, 408, 455, 758, 456, 458

(56) References Cited

U.S. PATENT DOCUMENTS 4,322,571 A    3/1982   Stanbery (List continued on next page.)

FOREIGN PATENT DOCUMENTS

| DE | 3502218 A1 | 7/1986 |
| DE | 4342764 A1 | 6/1995 |
| DE | 19621144 A1 | 11/1996 |

(List continued on next page.)

OTHER PUBLICATIONS

Klumpp A., et al. "Anisotropic etching for optical gratings", *Sensors and Autuators A* 51 (1995) 77–80.

Bhatnagar, Y.K., et al. , "On pyramidal protrusions in anisotropic etching of <100> silicon", *Sensors and Actuators A*, 36(1993) 233–240.

(List continued on next page.)

*Primary Examiner*—Caridad Everhart
*Assistant Examiner*—Lex H. Malsawma
(74) *Attorney, Agent, or Firm*—Townsend and Townsend and Crew, LLP

(57) ABSTRACT

The invention relates to a method of manufacturing layer-like structures in which a material layer having hollow cavities, preferably a porous material layer, is produced on or out of a substrate consisting, for example, of monocrystalline p-type or n-type Si and in which the layer-like structure, or a part of it, is subsequently provided on the cavity exhibiting or porous material layer. The layer-like structure, or a part of it, is subsequently separated from the substrate using the layer having the hollow cavities, or porous layer, as a point of desired separation, for example through the production of a mechanical strain within or at a boundary surface of the cavity exhibiting or porous layer. The method is characterized in that the surface of the substrate is structured prior to the production of the porous layer, or in that the surface of the porous layer is structured.

51 Claims, 15 Drawing Sheets

U.S. PATENT DOCUMENTS

| | | | |
|---|---|---|---|
| 4,620,364 A | * 11/1986 | Landis | 438/61 |
| 5,234,539 A | 8/1993 | Schiltz | |
| 5,318,676 A | 6/1994 | Sailor et al. | |
| 5,374,581 A | * 12/1994 | Ichikawa et al. | 438/459 |
| 5,387,541 A | * 2/1995 | Hodge et al. | 438/409 |
| 5,405,802 A | * 4/1995 | Yamagata et al. | 438/459 |
| 5,811,348 A | * 9/1998 | Matsushita et al. | 438/455 |
| 6,107,213 A | * 8/2000 | Tayanaka | 438/455 |
| 6,147,297 A | * 11/2000 | Wettling et al. | 136/256 |

FOREIGN PATENT DOCUMENTS

| | | |
|---|---|---|
| DE | 19522539 A1 | 1/1997 |
| EP | 0108897 A1 | 5/1984 |
| EP | 0312466 A1 | 4/1989 |
| EP | 0449589 A1 | 10/1991 |
| EP | 0528229 A2 | 2/1993 |
| EP | 0536788 A1 | 4/1993 |
| EP | 0553857 A2 | 8/1993 |
| EP | 0755068 A2 | 1/1997 |
| EP | 0757377 A2 | 2/1997 |
| EP | 0767486 A2 | 4/1997 |
| EP | 0779650 A2 | 6/1997 |
| EP | 0786801 A1 | 7/1997 |
| EP | 0797258 A2 | 9/1997 |

OTHER PUBLICATIONS

Oules, C., et al., "Silicon on Insulator Structures Obtained by Epitaxial Growth of Silicon over Porous Silicon", *J. Electrochem. Soc.*, 139(12) (1992) 3595–3599.

Zhang, Fuzu, et al., "Large Area, Concentrator Buried Contact Solar Cells", *IEEE Transactions on Electron Devices, 42(1) (1995)* 144–149.

Morris, J., et al., "Absorption enhancement in hydrogenated amorphous silicon–based solar cells", *J. Appl. Phys.* 67(2) (1990) 1079–1087.

Landis, Geoffrey A., "A Process Sequence For Manufacturing of Ultra–Thin, Light–Trapping Silicon Solar Cells", *Solar Cells* 29(1990) 257–266.

Patent Abstracts of Japan vol. 015, No. 258 (E–1084), Jun. 28, 1991 & JP 03 083339 A (Sumitomo Electric Ind Ltd), Apr. 9, 1991, see Abstract.

Vescan, L., et al., "Low–Pressure Vapor–Phase Epitaxy of Silicon on Porous Silicon", *Materials Letters*, 7(3) (1998) 94–98 (1988).

Yonehara, Takao, et al., "Epitaxial layer transfer by bond and etch back of porous Si", *Applied Physics Letters*, 64(16) (1994) 2108–2110.

Brendel, Rolf, "A novel process for ultrathin monocrystalline silicon solar cells on glass", *14th European Photovoltaic Solar Energy Conference*, Jun. 30, 1997–Jul. 4, 1997, pp. 1354–1357.

Brendel, Rolf, et al., "Sol–gel coatings for light trapping in crystalline thin film silcon solar cells", *International Conference on Coatings on Glass ICCG*, Oct. 27–31, 1996, Saarbrücken, Germany, pp. 1–16.

Oalting, S., et al., "Crystalline Thin Film Silicon Solar Cells By Ion–Assisted Deposition", *12th European Photovoltaic Solar Energy Conference*, vol. II (1994) 1815–1818.

Brendel, Rolf, et al., "Ultrathin cyrstalline silicon solar cells on glass substrates", *Appl.Phys. Lett.* 70(3) 91997) 390–392.

* cited by examiner

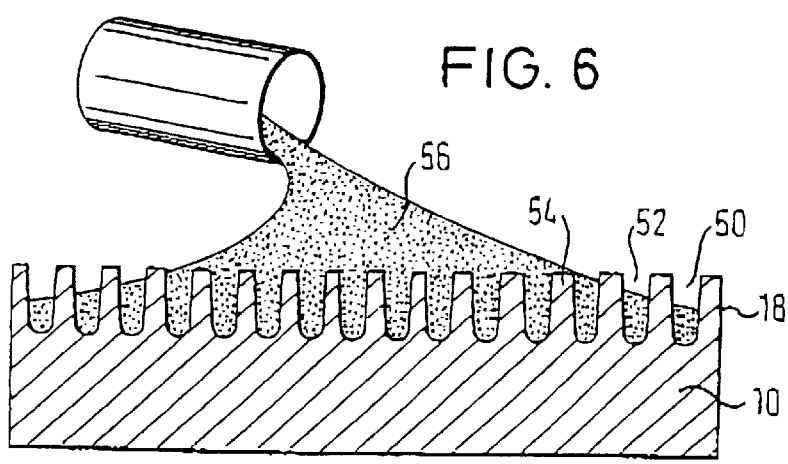
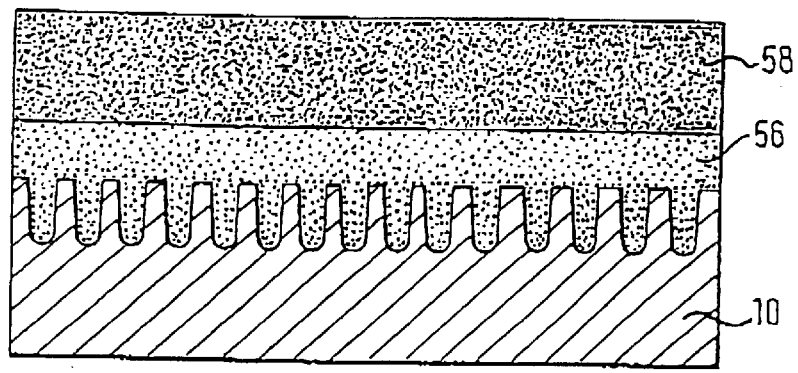
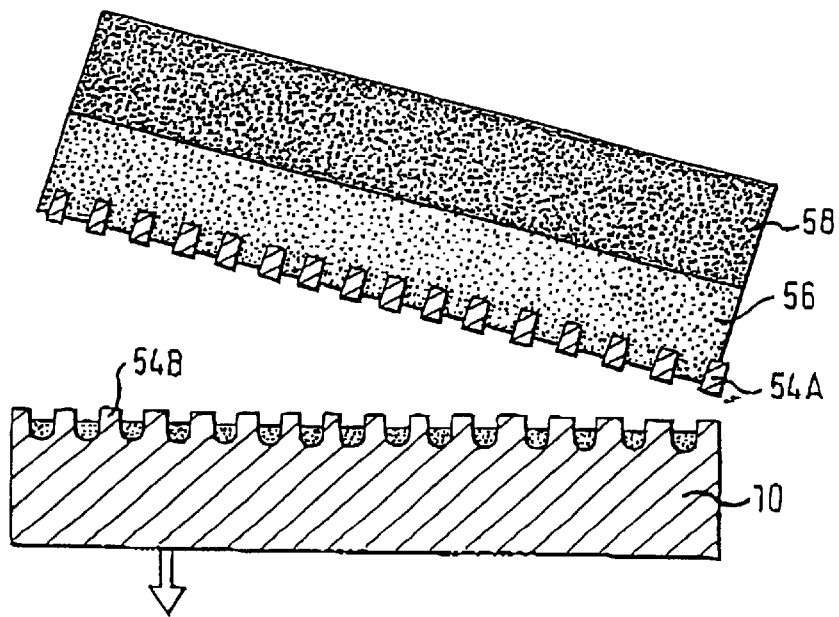
FIG. 6

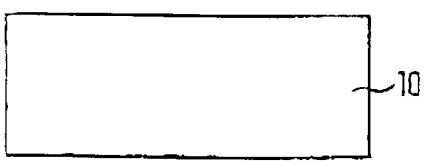
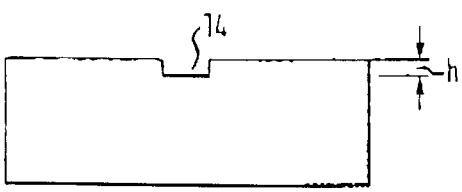
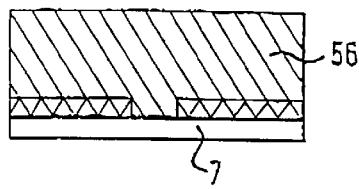
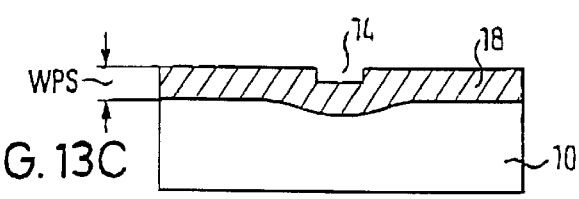
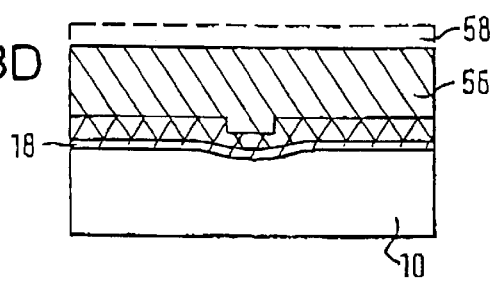
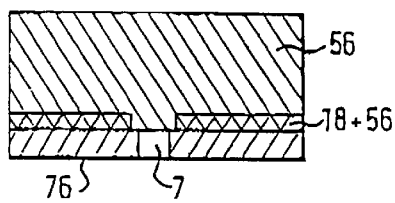
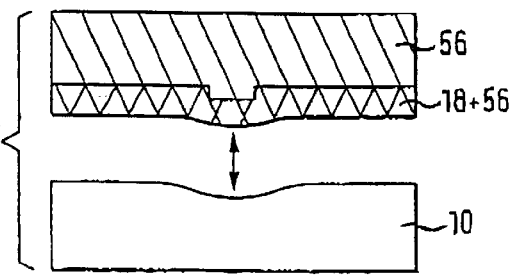
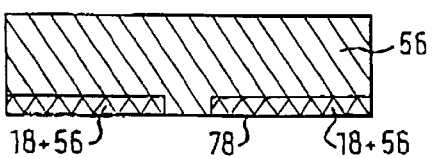

METHOD FOR PRODUCING LAYERED STRUCTURES ON A SUBSTRATE, SUBSTRATE AND SEMICONDUCTOR COMPONENTS PRODUCED ACCORDING TO SAID METHOD

BACKGROUND OF THE INVENTION

1. Field of the Invention

The present invention relates to a method of manufacturing layer-like structures in which a material layer having hollow cavities, preferably a porous material layer, is produced on a substrate consisting, for example, of monocrystalline p-type or n-type Si and in which the layer-like structure, or a part of it, is subsequently provided on the cavity exhibiting or porous material layer, and is subsequently separated from the substrate using the cavity exhibiting or porous layer as a position of intended separation, for example through the generation of a mechanical strain within or at a boundary surface of the cavity exhibiting or porous layer. Furthermore, the invention relates to different substrates which can be produced by this method and to novel semiconductor components which can be manufactured using the substrates of the invention.

2. Description of the Prior Art

A method of the initially named kind is known from several documents.

By way of example, a method of manufacturing a semiconductor body is described in the European patent application with the Publication No. 0 528 229 A1 in which a silicon substrate is made porous, a non-porous, monocrystalline silicon layer is formed on the porous silicon substrate at a first temperature and in which a surface of the non-porous, monocrystalline silicon layer is bonded to a second substrate having an insulating material at its surface. Thereafter the porous silicon layer is removed by a chemical etching process and a further monocrystalline silicon layer is grown onto the first-named non-porous monocrystalline silicon layer by an epitaxial process at a second temperature.

The sense of this method is to be able to grow monocrystalline silicon on any desired substrate. The method is, however, relatively complicated because the porous silicon layer must be etched away. Similar methods are also apparent from the European patent specifications with the Publications Nos. 0 536 788 A1 and EP 0 449 589 A1.

In EP-A-0 767 486 a method of the initially named kind is described in which the porous layer has a region of increased porosity and the separation of the layer-like structure from the substrate takes place by mechanical separation in the region of increased porosity. The region of increased porosity is produced either by ion implantation or by a changed current density during the manufacture of the porous layer. Even if the method step of the separation can be improved hereby, the method is more complicated and an increased danger exists of undesired separation prior to or during the production of the layer-like structure. A multiple use of the starting substrate is admittedly achieved here; nevertheless one would, in many potential uses, use the expensive monocrystalline substrate in a relatively wasteful manner.

A similar proposal can be found from the non-prior published EP-A-0 797 258.

The manufacture of silicon solar cells at favorable cost requires high-quality silicon, as far as possible single crystal silicon for high photo voltages, thin Si-layers for material saving, but nevertheless adequate absorption, low manufacturing temperatures for energy saving and favorably priced foreign substrates, for example glass for the mechanical stability.

So far as is known, there are no methods which satisfy all these criteria. For example, work is described in some of the above-named European patent applications in which one carries out CVD epitaxy at temperatures above 800° C. on porous silicon and transfers the so-formed epitaxial layers to a glass substrate. The silicon layers are not structured. For the separation, wet chemical processes or processes which destroy the substrate wafer are used. Applications in the photovoltaic field are not discussed.

The paper "Ultrathin crystalline silicon solar cells on glass substrates" by Rolf Brendel, Ralf B. Bergmann, Peter Lötgen, Michael Wolf and Jürgen H. Werner, which appeared in Appl. Phys. Lett. 70(3), Jan. 20, 1997, describes a possibility of manufacturing structured polycrystalline silicon layers which are suitable for use as photocells. The paper is, however, not concerned with single crystal material and requires a complex structuring of the glass substrate and also a complex contacting of the p- and n-layers in order to realize the photocell.

Further documents which are concerned with porous silicon for different purposes include publications from the Research Centre Jülich, which deal with the manufacture of lateral diffraction gratings on the basis of porous silicon and interference filters of porous silicon. The paper "Optical sensors based on porous silicon multi-layers: A prototype" by W. Theiβ, R. Arens-Fischer, S. Hilbrich, D. Scheyen, M. G. Berger, M. Krüger, M. Thönissen, gives further information concerning the manufacture of porous silicon structures and possible applications of the so-produced structures. Thin layer silicon solar cells are moreover described in the publication "Crystalline thin film silicon solar cells by ion-assisted deposition" by S. Oelting, Dr. Martini and D. Bonnet. This publication appeared on the occasion of the "Twelfth European Photovoltaic Solar Energy Conference" from Apr. 11–15, 1994.

SUMMARY OF THE INVENTION

The object of the present invention is to propose a method of the initially named kind which overcomes the above-named problems and enables the manufacture of components, in particular, but not only, silicon solar cells at favorable cost, with high quality silicon, so far as possible single crystal silicon, for photovoltages and thin silicon layers for material saving, but simultaneously achieving enhanced light absorption while using low manufacturing temperatures and cost favorable foreign substrates. In particular a method is aimed at in which the substrate used can be reused, or in which a plurality of like structures can be produced at favorable cost.

It is also an object of the present invention to propose methods for the production of different novel substrates which form the starting point for the production of further structures by means of epitaxial methods. Moreover, it is an object of the present invention to provide a photocell and other semiconductor components using the method of the invention which can be manufactured at favorable cost and which have excellent technical characteristics.

For the solution of this object methodwise, provision is made in accordance with the invention that the surface of the substrate is structured prior to the production of the porous layer or that the surface of the porous layer is structured.

Since the surface of the porous layer is structured, the mechanical separation at the boundary surface to the layer-like structure can apparently be carried out better, without need to produce porous layers with two different porosities. However, not only a mechanical separation comes into question, but rather also other methods which will be explained in more detail later.

Particularly important are the savings of time, effort and material which can be achieved by the use of structured layers, and indeed in particular when the structuring is exploited in the final product. Since the porous layer has a corresponding surface structuring, the layer-like structure can be provided with the same structuring.

In the manufacture of thin components with structured surfaces, only thin layer-like structures need then be produced. If one, however, operates in accordance with the prior art, which aims at planar surfaces, it is first necessary to produce thicker layers which must then be structured in a complicated manner by the removal of material.

That is to say, using the method of the invention, the porous layer can be made relatively thin, preferably in the range of about 100 nm to 10μ, so that relatively little material is lost and the working speed is improved, particularly since the once produced surface structuring of the substrate can be exploited for the manufacture of a plurality of identically structured layer-like structures.

When the separation of the layer-like structure from the substrate is carried out using mechanical stresses, then this separation takes place methodwise by means of the invention with structured surfaces in such a way that only the porous layer is damaged, but not the substrate or the layer-like structure. In many cases it is possible to carry out the separation at the upper boundary surface of the porous layer remote from the substrate so that the porous layer remains preserved. Accordingly, it is easy to reuse the substrate. For this, the porous layer is first removed, since it is as a rule damaged. A new porous layer is then produced on the substrate, after freeing it from the remainder of the porous layer, whereby the substrate can be reused. This is not possible in the prior art, when the porous layer is removed by etching or by mechanical removal from the layer-like structure.

It should be stated at this point that it would be possible to achieve this position of intended fracture or surface of intended fracture by a layer having hollow cavities instead by a porous layer, with it, for example, being possible to produce the hollow cavities by photolithography and for the hollow cavities to be open towards the free surface of the substrate. In this application only porous layers will now be discussed for the sake of simplicity. It should, however, be understood that these also include layers having hollow cavities and forming positions of intended fracture.

This type of separation of the layer-like structure from the substrate also succeeds when the surface of the porous layer is made flat. It is particularly favorable, in particular for the manufacture of the photocells or various other components, when the surface of the porous layer remote from the substrate is structured, since, on growing the layer-like structure on the porous layer, the layer-like structure reflects the structuring of the porous layer, so that, for example with a solar cell, the trapping of light takes place with substantially higher efficiency.

Since the structured surface of the substrate is preserved and can be reused, optionally after a cleaning step or after freshening up the structuring, a plurality of identical, layer-like structures can be manufactured from one substrate, which substantially increases the economy of the method, particularly since it is not necessary to newly structure the substrate every time.

The production of the structured surface of the porous layer can, in principle, take place in two ways. On the one hand, one can structure the surface of the single crystal substrate and then make it porous in manner known per se. The manufacturing process for the porous layer then automatically leads, with thin layers, to a porous layer having the same structuring as the structured substrate itself at its upper boundary surface remote from the substrate and at its lower (complementary) boundary surface facing the substrate. As an alternative to this, the planar surface of the single crystalline semiconductor substrate can be made porous, and the surface of the porous layer can be subsequently structured.

The substrate need not necessarily be monocrystalline, but can also be polycrystalline—assuming that the grain sizes of the polycrystalline material are larger than the width and thickness dimensions of the structuring, and the thickness of the porous layer, for example grain sizes of 100 μm to centimeter size.

The typical structurings which come into consideration for solar cells have thickness and width differences which each lie in the range from 0.5μ to 100μ. Through the use of thin porous layers in the range from approximately 100 nm to 10μ, the shape of the porous surface of the porous layer remains true to the structured shape of the substrate, even with multiple use of the same, i.e. also with multiple production of the porous layers on one and the same substrate.

The layer-like structure is at least partly applied by an epitaxial method to the porous surface. The porous layer namely has the same crystalline structure as the original substrate and is well suited for the growth of layer-like structures by means of epitaxial methods, with the so grown layer-like structure then having the same crystalline structure, i.e. they are also monocrystalline.

The epitaxial method can be carried out as a homo-epitaxial method or as a hetero-epitaxial method. With hetero-epitaxy it is favorable that the porous layer can yield somewhat, so that a pronounced strain in the boundary surface region need not be feared.

Through the epitaxial method at least one semiconductor layer belonging to the layer-like structure is applied onto the surface of the porous layer. Depending on the purpose for which the layer-like structure is intended, other layers can then be applied onto the so-produced semiconductor layer, with it not being compulsory for these further layers to likewise have a monocrystalline structure. However, there are many structures in which the layer-like structure will consist of a plurality of monocrystalline semiconductor layers, for example two layers which form a p-n-junction.

It is, however, also possible, in accordance with the invention, to deposit a metal layer onto the layer-like structure and/or to apply a dielectric, for example in the form of a transparent or light-permeable window layer, for example through the Sol-Gel process or by means of an adhesive.

It is particularly favorable if a carrier layer is provided which is either brought into contact with the layer-like structure, for example by adhesive bonding, by wafer bonding or by a diffusion soldering process, or is formed as part of the layer-like structure, for example through a continuation of the epitaxial process. If the carrier layer is applied onto the surface of the layer-like structure by adhesive bonding, by wafer bonding or by a diffusion process, then it can, for example, consist of glass or aluminum. This carrier layer of the carrier will normally consist of a favorably priced and stable material, for example of glass. The mechanical separation of the layer-like structure from the substrate can then take place in that one, for example, pulls on the carrier layer or on the carrier, so that the carrier layer or the carrier with the layer-like structure separates from the substrate. The carrier layer or the carrier then forms a further substrate, on which the layer-like structure is provided. One can now carry out further method steps on the free surface of the layer-like structure. For example, if the layer-like structure represents a finished semiconductor element, this can simply be covered over or provided with a passivation or with surface contacts. This is of exceptional importance, because one can, by means of the invention, produce contacts, gates or electrodes on both sides of the layer-like structure, which brings many advantages both from a technical manufacturing point of view as well as with regard to the physical characteristics of the so-produced semiconductor components.

In the event that the layer-like structure is not yet finished, one can produce further semiconductor layers by epitaxial methods on the free surface of the layer-like structure and can optionally also effect further structuring by photolithographic methods or other methods, insofar as this is necessary. The crystalline structure of the layer-like structure is then retained during the further course of the epitaxial method.

As initially mentioned, the substrate with the remainder of the porous layer can then be used anew, after the separation of the layer-like structure from the substrate at the point of intended fracture that is provided, as a substrate for the application of a further layer-like structure.

The method can be particularly favorably further developed in that a further porous layer is produced on the surface of the layer-like structure remote from the substrate prior to or after the separation of the layer-like structure from the substrate, and a further layer-like structure can be provided on the further porous layer, with the method optionally being repeatable several times, whereby a plurality of layer-like structures, in particular structured layer-like structures, arise above one another, which are respectively separated from the adjacent layer-like structure by a porous layer forming a position of intended fracture, wherein, after the production of such a multiple structure, the individual layer-like structures can be separated from one another by the production of a mechanical stress within or at a boundary surface of the respective porous layer.

Through the production of the so-described multiple structure, a very rational manufacture of individual layer-like structures is achieved, which can then be separated one after the other from the multiple structure. That is to say, prior to the separation of the individual layer-like structures from the multiple structure, they are each provided with a carrier layer or are secured to a carrier, precisely as is the case when a single layer-like structure is formed on the substrate, as described in more detail above.

In this variant of the method, further structures can also be optionally grown by epitaxial methods on the free surfaces of the so-formed layer-like structures.

An alternative variant of the method of the invention is characterized in that one generates or applies a porous material layer out of or onto a first substrate, the layer optionally having a structured free surface, for example having grooves arranged parallel to one another, in that one applies a second substrate onto the free optionally structured surface of the porous material layer and subsequently separates the second substrate from the first substrate using the porous layer as a position of intended fracture by the production of a mechanical strain such that a layer or sections of the porous material layer remains or remain adhered on the second substrate, whereby the second substrate can be used for epitaxial methods.

It is particularly favorable if, after the separation of the second substrate from the first substrate, the residue of the porous layer is removed from the first substrate, a new porous layer is produced on the substrate and the above process is repeated, with this process being optionally repeatable a plurality of times in order to produce a plurality of second substrates starting from a first substrate.

Since the sections of the porous material layer remain bonded to each second substrate, any desired layer-like structures can be grown onto these substrates by means of the epitaxial methods. Since the alignment of the crystal structure in each section of the porous material layer is the same, the structures grown on the second substrates by epitaxial methods likewise have a monocrystalline structure, so that one can, starting from an expensive substrate, produce a plurality of substrates for epitaxial methods in a favorably priced manner.

Various possibilities exist for applying the second substrate onto the first substrate. One possibility lies in using an adhesive; another possibility would be to deposit a metal layer onto the porous surface of the first substrate and to then connect this metallic layer to a carrier material in a different manner. A carrier material can also be connected to the porous layer of the first substrate by means of a diffusion brazing process. It is only important that after the removal of the second substrate, sections of the porous material of the first substrate are present in distributed manner on the surface of the second substrate.

Various possibilities exist for the production of mechanical stress within the porous layer, which leads to the separation of the layer-like structure or a part of it from the substrate.

The substrates produced by the method are intermediate products, which are valuable in themselves.

The method of the invention is in particular used for the manufacture of high quality solar cells. A further possible use is a radiation detector.

BRIEF DESCRIPTION OF THE DRAWINGS

FIGS. 6A to 6C are schematic illustrations of a variant of the method of the invention, FIGS. 13A to H are sketches to illustrate the manufacture of a semiconductor layer which is monocrystalline in certain regions and amorphous in others.

DETAILED DESCRIPTION OF SPECIFIC EXEMPLARY EMBODIMENTS

Figure 1:
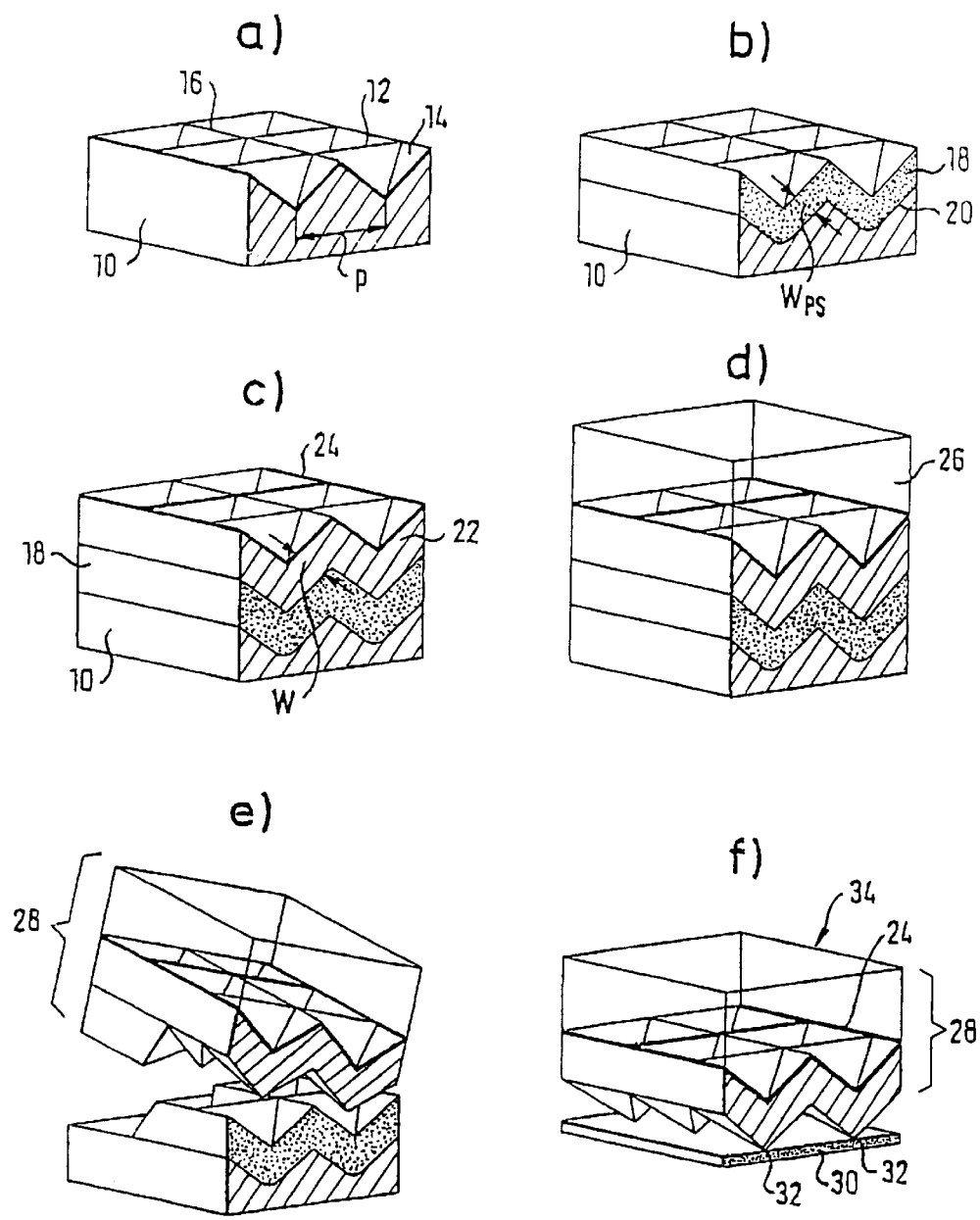
FIGS. 1A to 1F are a sequence of sketches to illustrate a first variant of the manufacturing method of the invention.

FIG. 1A shows a silicon substrate 10, for example of p-Si, with an n-Si substrate likewise entering into question. The one surface of the Si substrate 10 has a structuring 12 which one can consider as a matrix of pyramidal recesses 14, the base surfaces of which are placed directly alongside one another, so that the upper boundary of the surface is very similar to a square grid.

The substrate 10 is subsequently treated in manner known per se in order to produce a porous silicon layer 18 (FIG. 1B). The upper side of the porous silicon layer 18 has the same shape as the structured surface of the Si substrate 10. The boundary surface between the porous silicon layer 18 and the substrate has the same shape.

The substrate 10 is now coated by means of an epitaxial method. In this manner a layer 22 of epitaxial silicon first arises on the surface of the porous layer 18. In principle, any of the known epitaxial methods can be used for the formation of this layer 22, i.e. amongst other things gas phase epitaxy (CVD), ion assisted epitaxy, plasma assisted epitaxy, liquid phase epitaxy and molecular beam epitaxy (MBE).

It can be seen from FIG. 1C that the free surface of the layer 22 likewise has the same shape as the structured surface 12 of the silicon substrate of FIG. 1A and of the porous silicon layer 18 of FIG. 1B. The boundary surface between the layer 22 and the porous layer 18 likewise has the same shape. This applies, above all, if the porous layer 18 is thin. In this Figure the layer thickness is given by "w".

Furthermore, the layer 22 has the same crystal orientation as the substrate 10 and the porous layer 18 formed from the substrate 10. It consists, moreover, of monocrystalline silicon.

In a further step, which is not especially shown here, a grid electrode 24 is applied to the layer 22, and indeed in such a way that the material of the grid electrode 24 extends along only some of the lines forming the grid 16. Thereafter, the layer structure formed by the layer 22 and the grid 24 is provided with a glass layer 26. This glass layer 26 can be produced by the so-called Sol-Gel process, which is, for example, described in the publication "Sol-gel coatings for light trapping in crystalline thin film silicon solar cells" by R. Brendel, A. Gier, M. Mennig, H. Schmidt and J. H. Werner and was distributed at the "International Conference on Coatings on Glass ICCG" from Oct. 27 to 31, 1996 in Saarbrücken, Germany. In accordance with this, a mechanical stress is produced in the porous layer, for example in that one "peels off" the glass cover disc 26 from the substrate 10, as shown in FIG. 1E. In this manner a separation of the layer-like structure from the porous structure 18 takes place, with the layer-like structure consisting in this example of the epitaxial silicon layer 22, the grid electrode 24 and the glass cover 26. In this respect the separation takes place in advantageous manner at the boundary surface between the porous layer 18 and the epitaxial layer 22, with this boundary surface functioning, so to say, as a position of intended fracture, since here the mechanical bond can be overcome most easily. Thereafter, in accordance with FIG. 1F, the layer-like structure 28 is applied onto a metal plate 13 in accordance with FIG. 1F and forms in this manner a solar cell. The metal plate 30 serves, on the one hand, for the provision of a contact to the pyramid-like tips 32 of the monocrystalline silicon layer 22 and serves, on the other hand, as a reflector, so that light, which has not yet been absorbed in the silicon, is sent through the layer 22 again, so that a further absorption possibility is provided.

One notes that the grid 24 is filigrane and thus does not produce any notable light loss by reflection of the incident light 34.

The design of such a photocell will be explained in more detail later with reference to FIGS. 8 and 9.

Figure 2:
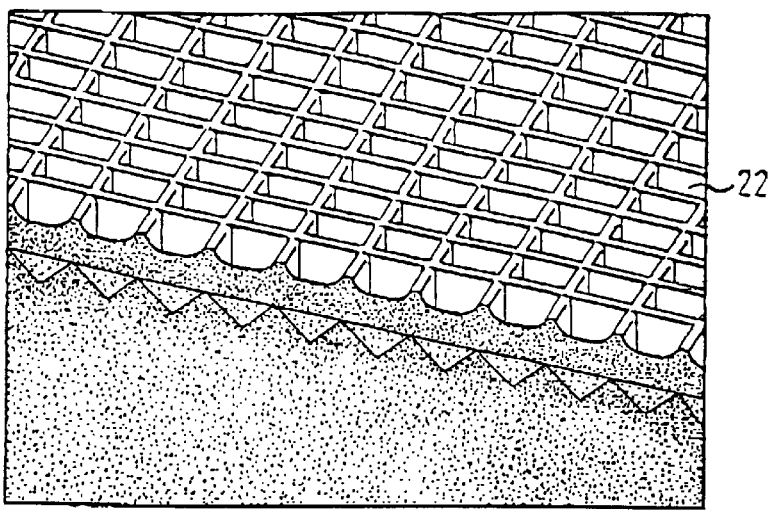
FIG. 2 illustrates an electron microscope recording of a layer-like structure, corresponding to FIG. 1B without carrier layer.
Figure 3:
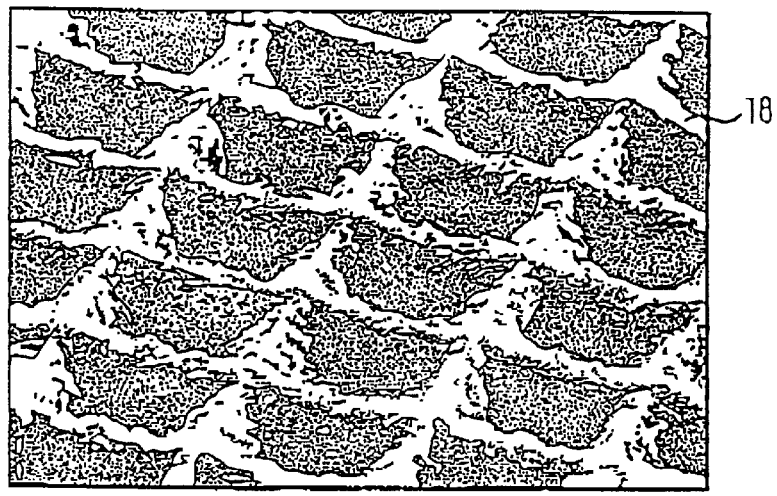
FIG. 3 illustrates an electron microscope recording of the top side of the substrate after the removal of the layer-like structure of FIG. 2, but prior to the carrying out of the cleaning step.
Figure 4:
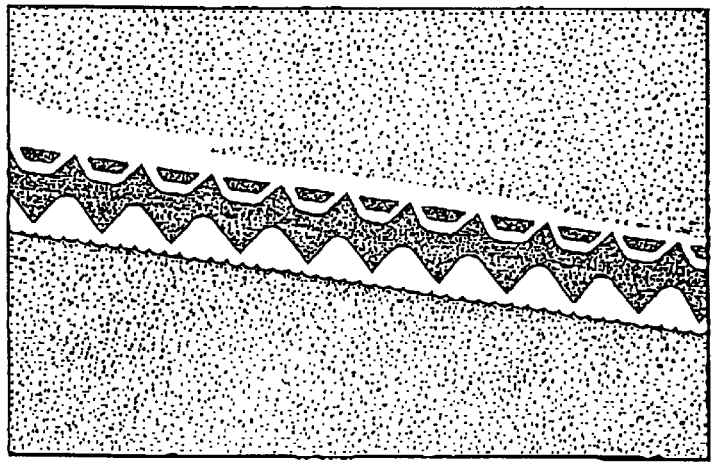
FIG. 4 illustrates an electron microscope recording of the layer-like structure of FIG. 1 from a different viewing angle in order to document the quality of the lower side of the layer-like structure.

As proof of the quality of the method, reference is first made to FIGS. 2, 3 and 4. Each of these Figures shows an electron microscope recording, and indeed in FIG. 2 from the top side of an epitaxial Si layer 22 as shown in FIG. 1, and in FIG. 3 from the free surface of the porous layer formed after the removal of the epitaxial Si layer 22. FIG. 4 is a further recording of the epitaxial layer 22, but from a different perspective, from which the problem-free profiling of the boundary surface to the porous layer 18 can be seen.

In the recording of FIG. 3 one sees the surface of the substrate 18 after the separation of the epitaxial layer 22, but before the cleaning of the free surface from the residues of the porous layer 18. After the cleaning, which can take place by means of etching and/or an ultrasonic treatment, the free surface of the substrate 10 presents itself in the same clean form as was present for the production of the porous layer 18 and the growth of the epitaxial silicon layer 22. Thus, the substrate 10 can be provided with a new porous layer 18 and reused for the growth of further layer-like structures or semiconductor layers, precisely as the layer 22 of FIG. 1C.

This is thus a first possibility of multiply using the substrate 10.

Figure 5:
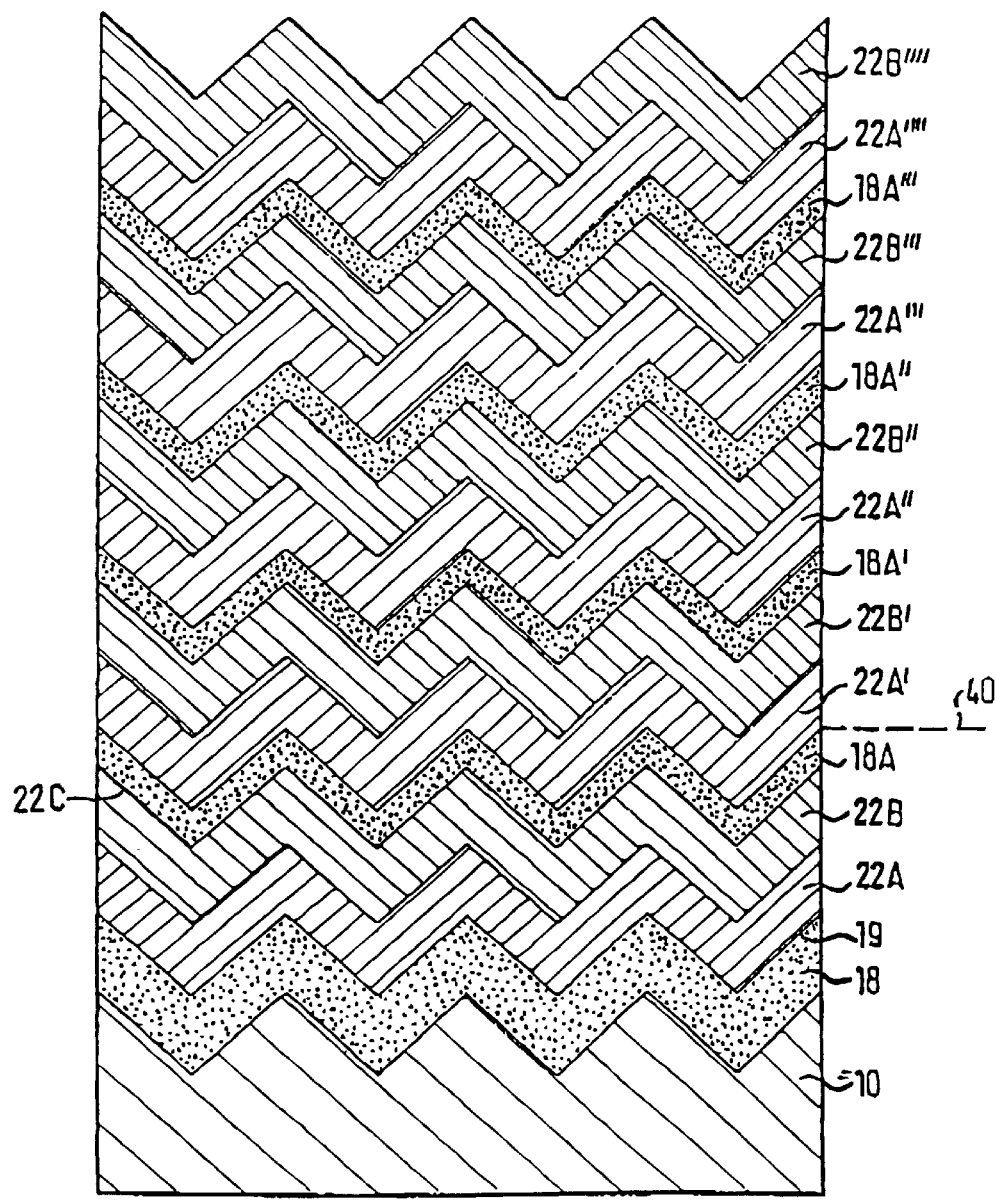
FIG. 5 is a schematic illustration of a possible multiple structure which can be produced by means of the method of the invention.

FIG. 5 shows in schematic form a variant of the method of the invention in which a multiple structure is produced.

In the example of FIG. 5 a substrate 10 is likewise present in the form of p- or n-Si and a structured porous layer 18 is also present here above the substrate 10. The structuring of the initially free surface 19 of the porous layer 18 corresponds, for example, precisely to the profiling in the corresponding boundary surface in the embodiment of FIG. 1. That is to say, the reference numeral 19 represents the uppermost boundary surface of the porous layer 18 (in other words the boundary surface of the porous layer 18 remote from the substrate 10).

Two sequential layers of n-Si and p-Si, i.e. the layers 22A and 22B, are now grown by an epitaxial method onto the substrate 10, i.e. onto the structured surface of the porous layer 18. After the production of the two layers 22A and 22B, the free surface of the p-Si layer 22B initially extends up to the height 40 and has the same profiling as the boundary surface 19. Thereafter, the layer 22B is treated in order to form it into a further porous layer 18A in the upper region, which, for example, corresponds in form to the porous layer 18 of FIG. 1. The method is now multiply repeated, whereby further layers 22A', 22B', 22A", 22B", 22A''', 22B''', etc. arise, and each time the free surface of the upper layer 22B (B', B", B''' etc.) is treated in order to produce a porous Si-layer 18A', 18A", 18A'''.

The multiple structure of FIG. 5 can then be split up in that one separates the individual layer-like structures 22A, 22B (in the sequence 22A"", 22B""), (22A''', 22B'''), . . . (22A, 22B)) from the multiple structure. The splitting up of the layer packet in accordance with FIG. 5 into individual structures, which each consist of an n-layer and a p-layer, i.e. 22A, 22B and 22A', 22B', and 22A", 22B", etc., can also take place in that one lays the layer packet for a relatively long time, for example in the range from hours to days, in an etching bath. It is only problematic that the useful layers 22A, 22B and 22A', 22B', etc. will also be etched at the surface, although the etching of the porous material takes place substantially more rapidly.

In an alternative method of carrying out the separation, a carrier can in each case be connected to the free surface of the next layer pair to be separated, or the separation can, for example, take place through thermal gradients. After cleaning the layer pairs can then be provided with electrodes as desired.

It is apparent that the layer pairs 22A, 22B, etc. explained in the examples relating to FIG. 5 form an n-/p-junction. After the application of any electrodes that are required, surfaces of the layer pairs can then be connected to a carrier material, for example provided with a glass layer, as provided in FIG. 1. The possibility now exists of turning over the so-treated layer pairs and applying further structures by epitaxial methods onto the then free surface of the respective lower layer 22A (22A', 22A", etc.). Under some circumstances the substrate 10 with the structured porous layer 18 can be reused.

At this point it should be emphasized that the structuring of the free surface of the porous Si layer is in no way restricted to the previously mentioned inverted pyramid shape. In actual fact, the most diverse structurings can be selected, as desired.

This is, for example, also brought to expression by the embodiment of FIG. 6. FIG. 6A namely shows again the Si-substrate 10 with a porous Si layer 18. In this case the porous Si layer 18 has a groove-like profiling 50, consisting of longitudinal grooves 52 which are arranged alongside one another, which are respectively separated from one another by webs 54 of the porous silicon material. These grooves 52, or the corresponding webs, can be made in accordance with any desired methods, for example also by mechanical milling, or by local crushing of the porous layer 18 with a coining tool or a profiled roll.

It is now schematically illustrated in FIG. 6A how an adhesive 56 is applied to the surface of the porous layer. This adhesive 56 serves for the attachment of a second substrate 58, which can consist of any desired material, onto the first substrate 10, so that the finished structure in accordance with FIG. 6B results. If a mechanical separating process is now carried out, then the second substrate 58 together with the adhesive layer 56 and the sections 54A of the webs 54 can be separated from the first substrate 10 and the web remainders 54B, as shown in FIG. 6C.

As a result of the manufacturing method, the porous layer 18 has the same crystal orientation as the substrate 10 and this crystal orientation is accordingly also contained in the webs 54. Moreover, this crystal orientation is the same in all webs 54 and this also applies to the sections 54A which are secured to the second substrate 58. The substrate 58 with the sections 54A can now be used in order to grow further structures onto the free surface having the sections 54A by means of epitaxial methods. In this way, a monocrystalline semiconductor material again arises on the substrate 58, i.e. monocrystalline silicon on the webs 54A.

The first substrate 10 can now be reused in that the remainder of the porous layer 18 is fully removed and the method of FIG. 6 repeated. The repetition of the method can take place multiply.

Even though, in the embodiment of FIGS. 6A to 6C, this structure is preferably realized using a profiled or structured surface, the possibility also exists in accordance with the invention of operating with a non-structured porous layer, above all, but not exclusively, when the separation takes place with the method described in conjunction with FIG. 22 at the boundary surface to the porous substrate.

Figure 7:
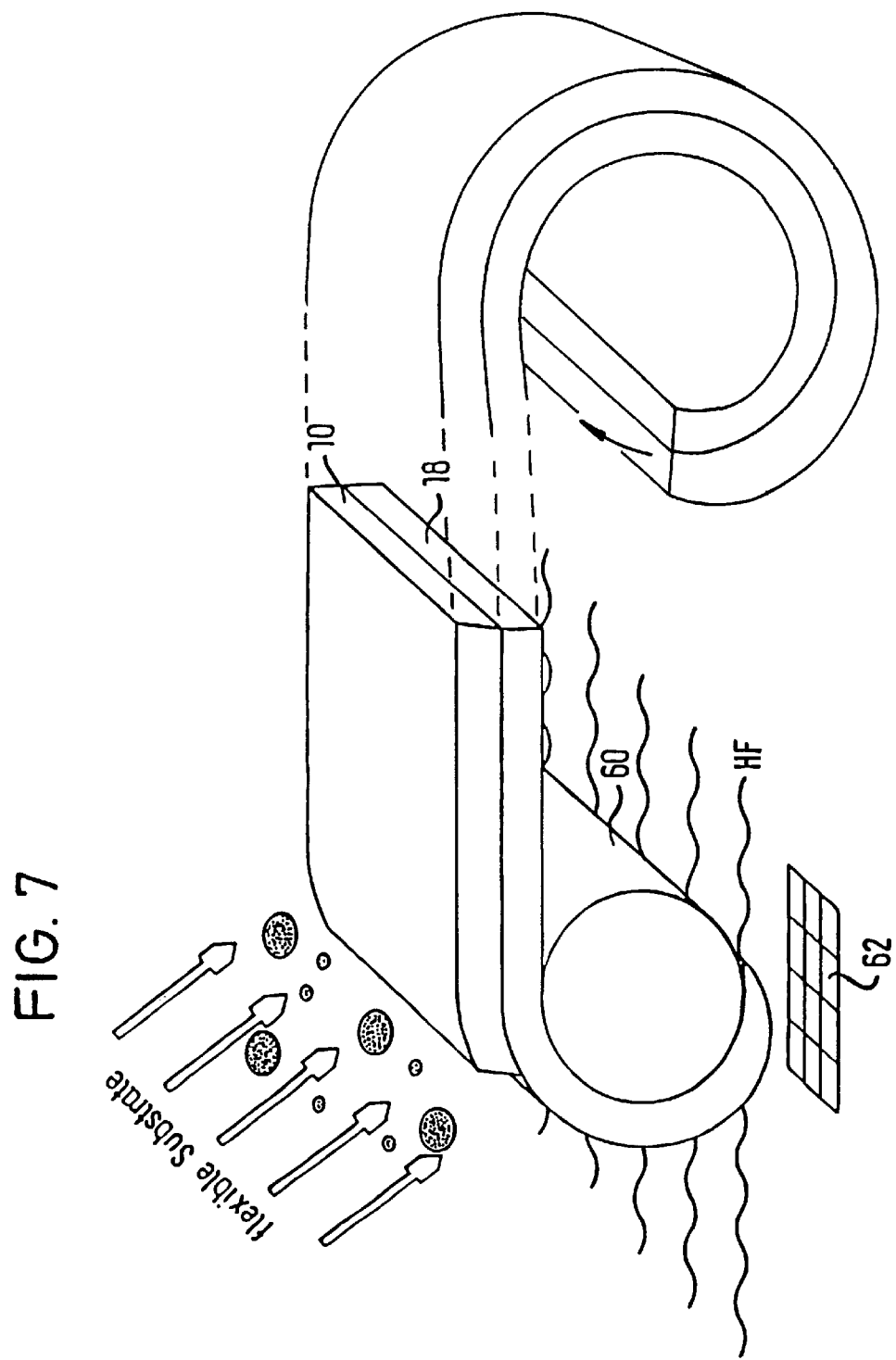
FIG. 7 illustrates a further variant of the method of the invention.

FIG. 7 shows a further embodiment of the method of the invention, likewise in a schematic representation.

Here, a cylinder of single crystal silicon is continuously treated in order to produce a porous silicon surface. For this purpose the lower segment of the cylindrical bar 60 is dipped into a HF bath and a voltage is produced between the grid electrodes 62 and the cylindrical bar 60 which leads to a current flow which, in combination with the HF bath, serves for the production of the porous Si layer.

During the rotation of the cylindrical bar 60 flexible substrate material is applied onto the exposed surface of the porous Si layer, for example sprayed on with subsequent curing, and is used in order to peel off the porous Si layer from the surface of the cylindrical bar 60. Since the porous Si layer 18 was originally curved, but now extends in a straight line due to the pulling off by means of the substrate 10, it has a permanent strain which can be exploited for the production of some components. This variant has the advantage that one produces a strip-like structure, i.e. a strip-like substrate 10 with a strip-like porous layer 18 which can be used for the most diverse purposes.

For example, the porous layer 18 can be structured and then used to carry out one of the previously explained methods. I.e. a semiconductor layer is initially produced by an epitaxial method on the free surface of the porous Si layer 18, optionally after it has been structured, with the corresponding semiconductor layer or layers in turn consisting of single crystal material.

If a flexible substrate is later made into a tube and then subjected to epitaxy, a single crystal Si tube will arise. This could be of importance as a silane feedline for epitaxial reactors, because a silicon tube is mechanically very stable and does not contain any foreign atoms. Also it could be used, as a result of the flexibility, for the manufacture of extended foils on optionally curved glass surfaces, for example for vehicles operated with solar energy.

The different methods which are used will now be explained in more detail.

1. Method of structuring the substrate wafer with inverted pyramids:
    a) Oxidation (1% Trans LC) of the (100) orientated and polished Si wafer at 1000° C. for 45 minutes. A 100 nm thick $SiO_2$ layer arises.
    b) Photoresist spun on and photolithographically exposed using a net-like mask. As a result of the mask geometry, the photoresist only remains after development on ca. 2 $\mu$m broad webs; 11×11 $\mu m^2$ free surfaces are present between the webs.
    c) The oxide is removed in ca. 2 minutes with buffered HF. The photoresist is removed.
    d) RCA 1 and RCA 2 cleaning concluded with HF dip.
    e) The inverted pyramids are etched in an 8% KOH solution at a temperature of 80° C. in 10 minutes. After the etching process, the sample is rinsed in high-purity water and dried. Oxide webs, to the extent they are still present, are removed. With this anisotropic etching technique, crystal surfaces of the orientation (111) arise. The free bonds at the (111)-surface can be stably saturated with hydrogen, so that the creation of $SiO_2$ at the surface is reliably avoided. Thus, for the subsequent epitaxial steps, methods and reactors can also be considered which do not permit a thermal decomposition of the oxide.
    f) Alternative method:
        f1) Randomly arranged pyramids by anisotropic etching in KOH (no photolithography)
        f2) Mechanical grinding with specially shaped saw blades (typical structure size 100 $\mu$m)
        f3) Porous silicon profiled in depth is produced by non-uniform illumination (n-type Si) which is then removed again
        f4) The starting wafer can be multicrystalline Si, for example block-cast material.
2. Method of manufacturing the porous layer at the surface of the structured wafer:
    a) The wafers are B-doped with an acceptor concentration between $50 \times 10^{18}$ $cm^{-3}$ and $2 \times 10^{19}$ $cm^{-3}$. RCA1 and RCA2. Removal of the residual oxide with HF.
    b) The etching apparatus corresponds to that laid open in patent 0 536 788 A1, FIG. 2b. The porous silicon is produced by anodic etching in $HF:H_2O:Ethanol=1:1:2$ at room temperature. The structured side of the substrate faces towards the cathode. The porosity of the layer is regulated by the current density; typical current densities amount to 1 to 100 $mA/cm^2$.
    c) We produces a ca. 150 nm thick first porous layer of low porosity (ca. 35%), followed by a ca. 10 $\mu$m thick second porous layer of higher porosity (50%).
    d) The silicon disc with the structured and porous surface is oxidized at 400° C. for 30 minutes in dry $O_2$-atmosphere and stored under inert gas ($N^2$) prior to epitaxy.
3. The epitaxial method of ion-assisted deposition: This process is described in detail in the paper "Crystalline thin film silicon solar cells by ion-assisted deposition" by S. Oelting, D. Martini, D. Bonnet. The samples from which SEM recordings were made in accordance with FIGS. 2 to 4 were subjected to epitaxy as follows:
    a) RCA 1 and RCA 2 cleaning with an HF dip (30 s in 5% HF, subsequent rinsing in deionized water).
    b) Introduction into the reactor and permitted to outgas at 400° C. to 500° C.
    c) Heated to 850° C. for 10 minutes for the removal of the residual oxide.
    d) 10 $\mu$m thick silicon layers (measured parallel to the macroscopic surface normals of the substrate wafer) were grown with Ga-doping of $5 \times 10^{17}$ $cm^{-3}$. The temperature of the Ga-crucible is 670° C.; the substrate temperature amounts to 700° C. The rate of deposition is 4 $\mu$m/h. The coating takes place in high vacuum ($<10^{-7}$ mbar). Layers with doping sequences, in particular a pn-junction produced during epitaxy, were likewise satisfactorily separated.
    e) Alternative Epitaxial Method:
        e1) Liquid-phase epitaxy (LPE). Interesting because LPE is possible at temperatures below 850° C.
        e2) Solid-phase crystallization (SPC) of amorphous Si (a-Si). Interesting because deposition plants for large area a-Si-deposition are prior art. Disadvantage, SPC is slow (5 . . . 10 h for the recrystallization).
        e3) Gas-phase epitaxy (CVD) as in patents by Canon. Disadvantage, CVD requires deposition temperatures >900° C. at which the porous material sinters together. The mechanical separation is difficult or impossible.
        e4) Plasma-assisted gas-phase epitaxy (LPCVD). Interesting because it is possible at low temperatures.
        e5) Hot-wire epitaxy, because higher deposition rates (>10 Angström/S) possible at low temperature (<600° C.).
        e6) Laser crystallization of amorphous Si, because it is rapid and only involves low temperature loading of the substrate and of the porous Si.
4. Process for the separation:
    a) The 10 $\mu$m thick epitaxial layer on the porous Si on the substrate wafer is laid onto a heating plate at a temperature of 125°, with the Epi-layer upwardly.
    b) Glycolphtalate is placed on the heated Epi-layer and a 2 cm×2 cm=4 $cm^2$ sized cover glass is laid on this in turn. This transparent polymer softens, flows under the weight of the glass plate and thus leads after 10 minutes to a full exclusion of air in the region between the Epi-layer and glass. After cooling down, the glass is connected to the structured Epi-layer.
        b1) Using a different adhesive from glycolphtalate, for example plastics customary in the photovoltaic field.
        b2) Use of mechanical carrier other than glass, for example plastic foils. Such flexible carriers can exploit the fact that a thin structured Epi-layer is also very flexible (flexible solar cells).
        b3) Use of Sol-Gel glasses which are cast onto the Epi-layer and then harden. Particulars of Sol-Gel techniques are described in the section "Experimental" of the paper "Sol-gel coatings for light trapping in crystalline thin films" presented on the occasion of the "International Conference on Coatings on Glass" which took place in Saarbrücken, Germany, from Oct. 27–31, 1996.
        b4) Anodic bonding of the structured Epi-layer onto glass or "direct wafer bonding" of the Epi-layer onto Si.
    c) The glass with the Epi-layer is now simply lifted off. The porous layer is partly broken at the middle; it partly remains on the substrate and partly sticks to the Epi-layer. A 2-minute ultrasonic treatment removes all porous Si residues. The Epi-layer bonds firmly to the glass. Little mechanical force is required for the lifting of the glass with the Epi-layer from the substrate when ultrasonic treatment is carried out before the lifting.

Alternative methods for the mechanical separation:

c1) Shock-like heating (for example) of the Epi-layer with a light pulse produces a large temperature gradient in the porous layer which leads to the fracture of the porous layer.

c2) The filling of a liquid or of gas into the hollow cavities of the porous layer. The liquid or the gas is caused to expand and thus cracks off the Epi-layer.

c3) Larger mechanical pressure on the Epi-surface.

c4) Resonant coupling of radiation into the porous layer which functions as a wave guide and thus concentrates the radiation at the porous material.

Some semiconductor components will now be described which can be realized by means of the present invention.

Figure 8:
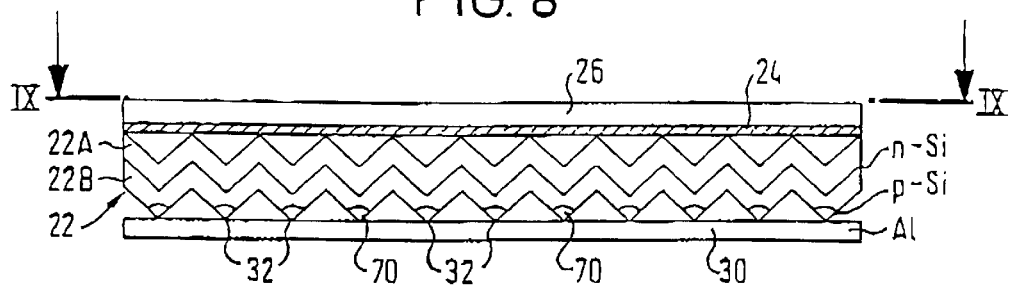
FIG. 8 is a schematic cross-section through a solar cell produced in accordance with the method of the invention.
Figure 9:
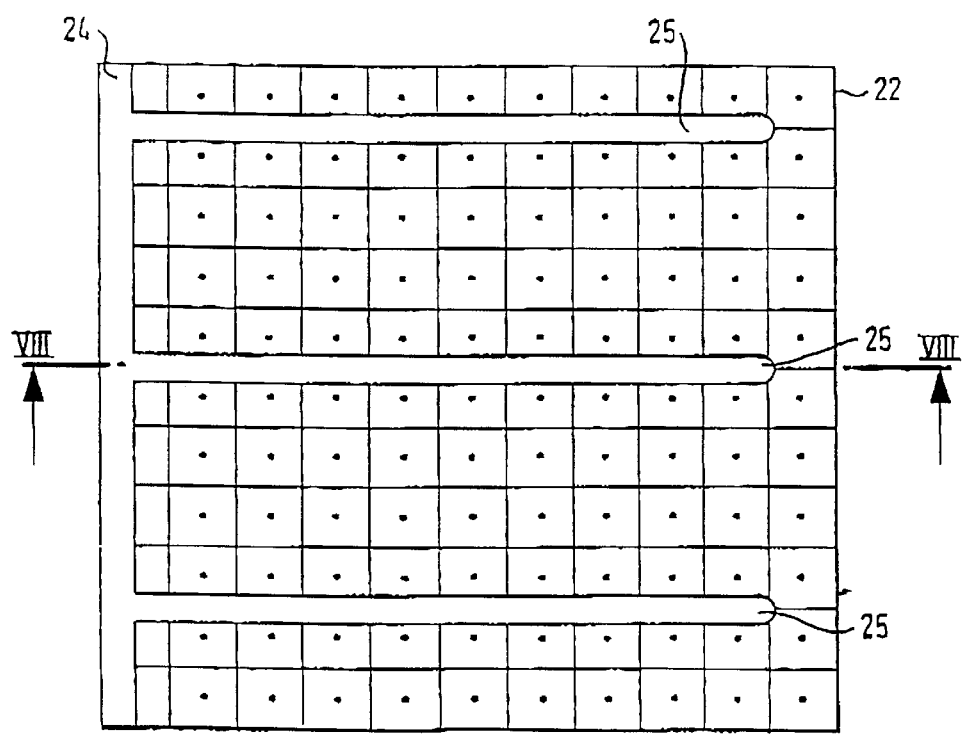
FIG. 9 is a plan view of the structure of FIG. 8 in the plane IX—IX.

FIGS. 8 and 9 show first of all a photocell, here in the form of a solar cell, which comprises in the core a layer-like structure 22, consisting of a layer of n-type Si and having the same shape as the layer 22 of FIG. 1.

The aluminum plate or foil 30 is located at the lower side of the layer-like structure 22 and is in contact with the pyramid-shaped tips 32 of the layer-like structure 22. Through a heat treatment aluminum atoms diffuse into the tips of the layer-like structure 22, which is shown by the reference numeral 70, and produce there p-type Si instead of n-type Si, i.e. the pn-junction, which is necessary for a photocell.

As an alternative to this, the layer-like structure 22 could, for example, consist, in accordance with FIG. 5, of a first layer 22A of n-type Si and a second layer 22B of p-type Si, which is indicated by the boundary surface 22C shown in broken lines. The design of the lower reflector, which simultaneously forms an electrode, remains the same as previously described.

Above the layer-like structure 22 there is located the grid electrode 24, which in this example has the finger shape which can be seen from FIG. 9.

In the practical embodiment the fields are somewhat other than is shown in FIG. 9. Each finger 25 of the grid electrode has a width of approximately 20$\mu$, i.e. approximately twice the width dimension of the individual pyramids of the layer-like structure 22. Furthermore, grid fingers 25 are not present, as shown, at every fifth grid line, but rather a much larger number of uncovered grid cells lies between them, for example 1000.

It is also entirely possible to produce the grid electrode 25 from a transparent material, for example indium tin oxide. The grid electrode 25 can also be applied over the full area on the underside of the plate 26 or onto the top side of the layer-like structure 22.

The method of applying the glass plate takes place in the manner which will be described later.

For solar applications the structuring in the Si layer is important because only in this way can so much sunlight be absorbed in a thin layer. In distinction to known methods (direct silicon deposition on flat or textured glasses) both the front side and also the rear side are freely accessible in the method described here.

Complicated contact schemes (such as are for example described in the publication Appl. Phys. Letters, Vol. 70, No. 3 of Jan. 20, 1997, pages 390 to 392) are not required. The solar cell manufacture is particularly simple if one already produces the p-n-transition during epitaxy, i.e. with the layers 22A and 22B, and then clamps the layer-like structure, i.e. the waffle, simply between a metal mirror (for example the above-described sheet of aluminum 30) and a transparent conductor (for example indium tin oxide or zinc oxide) on a carrier material, for example glass. Then no vapor deposition of contact fingers is any longer required. The mechanical pressing is sufficient.

The reusability of the structured substrate wafer is an important aspect for solar cell applications. It should be possible to reduce the thickness of the porous layer 18 from the previously used experimental value of 10 $\mu$m to less than 1 $\mu$m. The smaller the porous layer can be made, the more frequently the substrate wafer can be reused.

Figure 18:
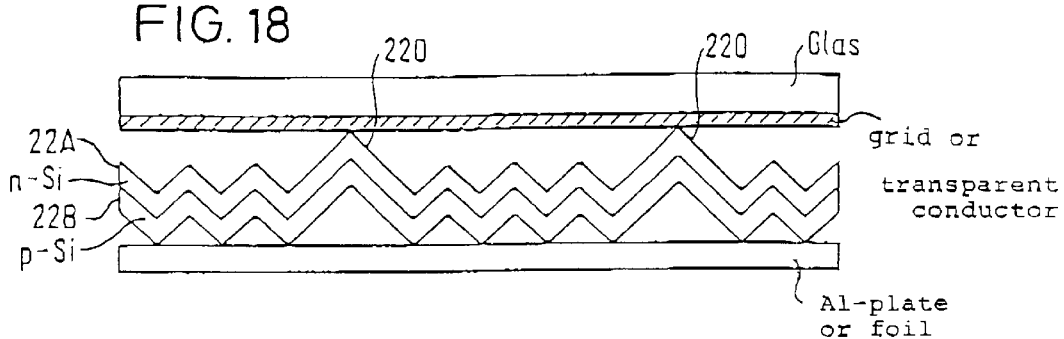
Figure 19:
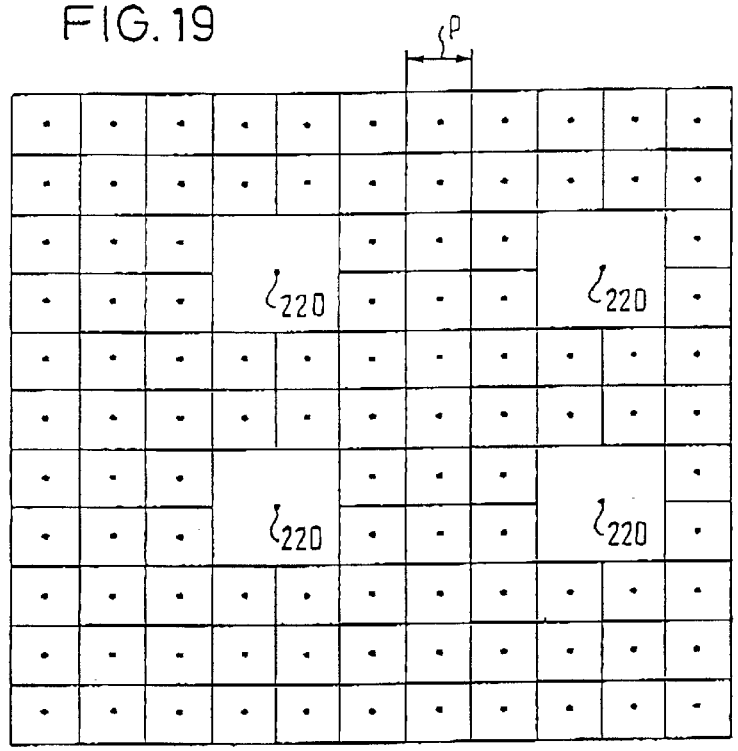

FIGS. 18 and 19 show a schematic representation similar to FIGS. 8, 9, but in a modified embodiment. Here, the structuring of the layer-like structure is effective somewhat differently, so that selected pyramid tips 22D of the upper layer 22A point upwardly, i.e. they extend higher than the other pyramid tips. This embodiment illustrates, how, by careful choice of the structuring of the substrate, the frequency with which contact is established to the layer-like structure can be controlled independently from the grid period P.

Figure 20:
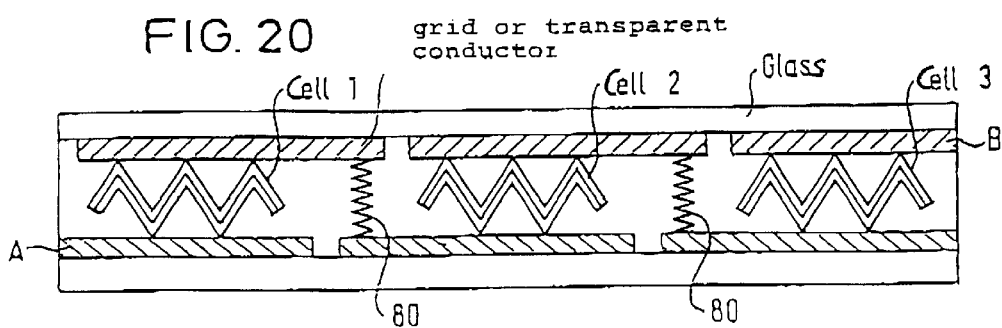
FIG. 20 illustrates the series connection of solar cells in the module.

FIG. 20 shows how diverse solar cells, for example in accordance with FIGS. 8 and 9, can be connected in series in order to form a module. As shown here, springs 80 are used in order to electrically connect the upper and lower electrodes or conductors to one another. The triple voltage of a solar cell can be tapped off between the points A and B.

Figure 10:
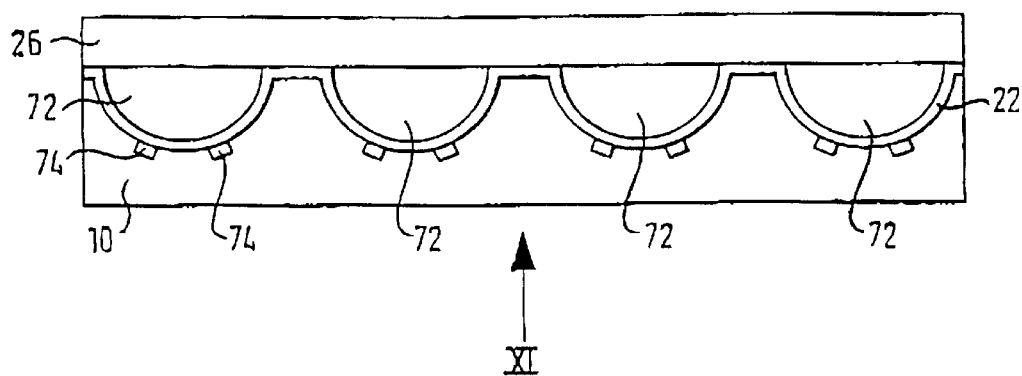
FIG. 10 is a schematic cross-section through a radiation detector.
Figure 11:
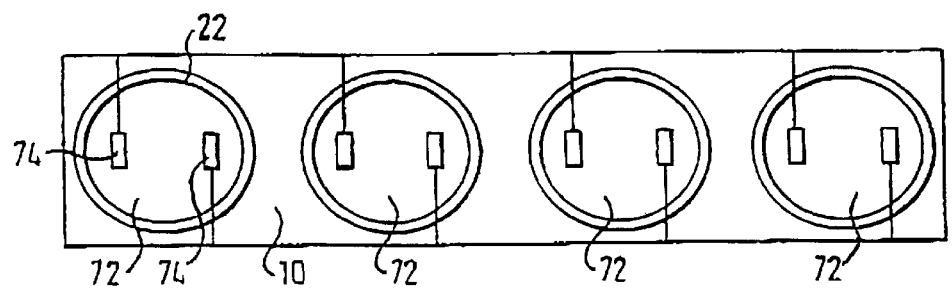
FIG. 11 is a representation of the detector of FIG. 10 as seen in the free direction XI.
Figure 12A:
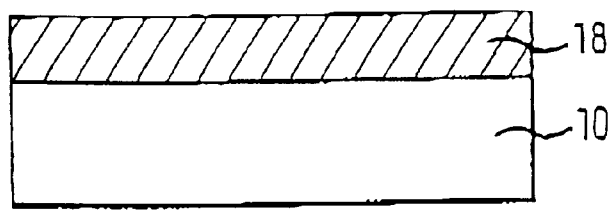
FIGS. 12A to D are schematic representations similar to FIG. 6, but with modifications.
Figure 12B:
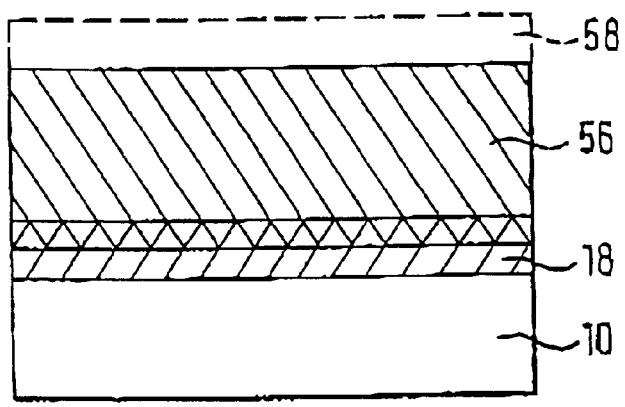
Figure 12C:
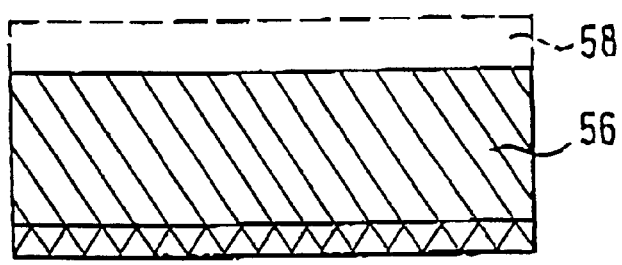
Figure 12D:
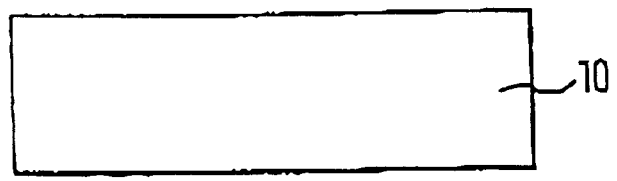

FIGS. 10 and 11 show in schematic form a possible embodiment of a radiation detector. A structured Si Epi-layer 22 bonded onto a glass substrate 10 produces many chambers 72 which are closed and are filled with a fixed quantity of gas. The so-formed chambers are closed by an upper glass plate 26. If radiation strikes through the glass into the respective chamber 72, the gas heats up, expands and bends the membrane formed by the layer-like structure 22. This expansion can be detected with piezoelements 74. If different regions of the detector are used for different wavelengths of the radiation to be detected, then filters can be provided, for example in the upper glass plate 26, which only transmit the respective radiation to be detected.

In FIGS. 10 and 11 only four chambers 72 are shown. In practice it will be more.

The structure of FIGS. 10 and 11 can also be used as a pressure sensor. The structured Si Epi-layer, bonded onto glass, shows many individually closed chambers, which are filled with a fixed quantity of gas. If the external pressure changes (air pressure or mechanical pressure) then the chamber walls bend. Such bending can be detected at each chamber individually with a piezoelement.

A further possible application of layer-like structured structures lies in the provision of special mirrors (micromirrors with special characteristics) which can be produced by a special structuring of the reflecting surface of the layer-like structure.

FIGS. 12A to D show a structure similar to that of FIG. 6, but without effecting a special profiling of the porous layer.

Specifically FIGS. 12A to D show a method of manufacturing a substrate, onto which a single crystalline semiconductor layer can be applied by means of epitaxy.

As a first step, a substrate 10 of a semiconductor material, preferably silicon, is treated in order to produce a porous layer in plate shape with planar boundary surfaces.

The adhesive 56—possibly already with carrier 58—is then brought onto the porous layer so that the adhesive at least partly penetrates through the porous layer 18.

Thereafter, the mechanical separation of the adhesive from the substrate takes place. If the adhesive is a compound which is sufficiently mechanically strong, then a carrier can be dispensed with. That is to say, the adhesive itself forms the carrier. The adhesive can, however, be reinforced with the carrier 58, if necessary.

The separation of the adhesive, possibly with carrier, from the substrate 10 takes place in such a way that the surface formed by the separation is permeated with porous semiconductor material of the desired orientation. The adhesive with this covering of porous material, and possibly with a carrier 58 at the side remote from the porous material, then forms a substrate for the carrying out of later epitaxial methods.

The substrate 10, which will normally have residues of porous material, is first cleaned in order to remove these residues. Then a new porous layer is formed, so that the substrate 10 can be reused.

FIGS. 13A to H show a method for the manufacture of a semiconductor layer which is monocrystalline in certain regions and amorphous in other regions.

In accordance with FIG. 13A a flat substrate is initially present, which can consist of monocrystalline or polycrystalline semiconductor material, for example Si.

FIG. 13B shows in very schematic form that the one surface of the substrate is structured by the introduction of grooves or holes or of a desired pattern by grinding or etching, and indeed with a structure depth h.

In accordance with FIG. 13C a porous layer of the thickness WPS≧h is produced in known manner, for example by anodic etching in HF.

Thereafter, an adhesive, for example Sol-Gel glass, is applied onto the structured surface of the substrate and penetrates wholly or partly into the porous layer. It forms a porous layer 18 permeated by the adhesive, as is shown in FIG. 13D.

Thereafter, the mechanical separation of the adhesive from the substrate takes place in accordance with FIG. 13E, the part of the porous layer permeated with adhesive 56 bonding to the adhesive. The substrate 10 can then be used further after a suitable surface treatment (removal of the residues of the porous layer and optionally new structuring).

The second substrate consisting of the adhesive (possibly with carrier) and of porous working material permeated by adhesive is treated, for example polished, in order to provide a layer-like structure which contains porous material in some regions, and indeed in a well-defined crystal orientation, but which has no porous material in other regions, as is shown in FIG. 13F.

Thereafter, in accordance with FIG. 13G, a full area deposition of an amorphous layer 76 onto the surface 78 provided in the step 13F takes place.

Thereafter, in accordance with FIG. 13H, a thermal treatment is, for example, carried out, so that a solid phase crystallization of the amorphous material takes place, where the porous material embedded in the adhesive provides nucleation seeds of well-defined orientation. The material remains amorphous at places where no porous layer is stored. The corresponding positions are positions where, in accordance with FIG. 13B, recesses 14 were formed during the structuring of the substrate 10. The structure in accordance with FIG. 13H now forms the starting point for the manufacture of the product, such as a flat screen. It is namely possible to so structure the product of FIG. 13H that luminescence is produced in the amorphous regions, while control transistors are formed in the monocrystalline regions, which control the state of luminescence in the amorphous region.

A further interesting possibility in accordance with the invention lies in first making a substrate porous close to the surface, as described above, with a part of the porous layer being converted into a single crystal non-porous layer in deviation from the previous description, and indeed by rapid melting and subsequent solidification, instead of applying a crystalline Si-layer onto the porous layer by means of epitaxy. That is to say, the uppermost layer of the cavity exhibiting or porous layer is first fused at least locally and then solidified again.

This can also be understood as a type of epitaxy on a porous substrate. However, the material for the epitaxy originates from the porous layer itself. After the production of the single crystal non-porous layer by fusing and subsequent solidification of the porous layer, the solidified layer can either be at once separated from the substrate or a layer-like structure can be grown onto the solidified layer, and the solidified layer subsequently separated from the substrate.

As previously, the separation takes place using the layer having the hollow cavities or porous layer as a position of intended fracture by the production of a mechanical strain within the cavity exhibiting or porous layer, or at a boundary surface of the cavity exhibiting or porous layer, or using the method described in conjunction with FIG. 22.

The fusing preferably takes place by irradiation with a laser light pulse from an excimer or copper vapor laser. This can, for example, take place in accordance with the method which is described in the publication "Ultra-large grain growth of Si films on glassy substrate" by Ishihara and M. Matsumura in Electronics Letters, Oct. 26, 1995, Vol. 31, No. 22, pages 1956 to 1957.

In distinction to the method described in this publication, porous silicon is to be transformed here into single crystal Si. A short light pulse is of advantage in comparison to a long-term irradiation, which is likewise possible, because in this way one can fuse only the region close to the surface and does not change lower lying porous material. A technical problem could consist in the fact that the thermal gradients which arise lead to a splitting off of the crystalline layer. This can either be avoided by suitable conditioning of the porous Si, or one could carry out the layer manufacture and the separation in one step, which is possible in accordance with the invention.

As an alternative to the laser treatment, zone drawing can also be considered as a method of rapid heating. In this the porous layer is guided beneath a linearly bundled electron beam or light beam, so that an areal crystalline layer arises. A corresponding method can be seen from the publication with the title "A new fabrication method for multicrystalline silicon layers on graphite substrates suited for low-cost thin film solar cells" in Solar Energy Materials and Solar Cells 41/42 (1996), pages 119 to 126, by M. Pauli, T. Reindl, W. Krühler, F. Homberg and J. Müller, with this paper having been published by Elsevier Science B. V.

The invention will now be described from another point of view.

In the following the process of perforated silicon (Ψ-process) for the manufacture of ultrathin silicon layers with efficient light trapping will be explained. For this a silicon layer is grown epitaxially on the porous surface of a structured, monocrystalline silicon substrate. Mechanical stress breaks the porous layer and thereby separates the epitaxial layer from the substrate. According to X-ray diffraction analysis, the $W_f$=5.8 μm thick silicon layer is monocrystalline. Reflectance measurements and ray tracing simulations predict a maximum short circuit current of $j_{SC}^* = 36.5$ mA/cm² for layers in the form of a waffle, when they are secured to glass. Transport simulations predict an efficiency η=16 to 19% for a film thickness of $W_f$=2 to 3 µm.

1. Introduction

Thin layer solar cells of crystalline silicon are known from the literature, for example. This and subsequently named documents are numbered within square brackets and set forth for the purpose of easier digest at the end of the description in a list. Thin film solar cells of crystalline silicon pose essentially three requirements: (i) the growth of a crystalline silicon layer of high quality and large grain size on an inexpensive substrate, (ii) the realization of a light trapping scheme for the compensation of the intrinsically weak, near infrared absorption in crystalline silicon, and (iii) an effective passivation of the grain boundaries and surfaces.

A structured, monocrystalline silicon layer on a float glass would contribute to the satisfying of all three requirements: (i) monocrystalline material can have a high volume quality and float glass is an inexpensive substrate; (ii) innovative layer structures, such as for example the pyramidal layer structure, permit the efficient trapping of light; and (iii) the monocrystalline structure prevents grain boundary recombination and enables an effective surface passivation at low temperatures. Such a fabrication of thin and structured monocrystalline silicon layers has hitherto not been shown in the literature.

In the following the novel process of perforated silicon for the manufacture of structured monocrystalline thin layers on float glass will be explained. In this respect the light-trapping behavior of such layers is experimentally investigated. The possible efficiency of the novel layer structure will be analyzed theoretically.

2. Process of the Perforated Silicon

The epitaxy on porous silicon was investigated in detail for the manufacture of thin monocrystalline silicon layers on isolating substrates. In this process an epitaxial layer grows by a CVD process at temperatures T>1000° C. on a planar, monocrystalline silicon wafer with a porous surface. The epitaxial layer is then applied by wafer bonding onto an isolator. Mechanical grinding then removes the substrate wafer. Chemical etching of the remaining porous layer completes the process. The absence of light trapping characteristics, the bonding process and the consumption of the substrate wafer prevent the use of this technique for photovoltaics for cost reasons.

In contrast to this, the process presented in the following can be used in photovoltaics, because the process facilitates the trapping of light, avoids bonding processes and no longer consumes the substrate wafer. FIGS. 1A to F illustrate the process step for step, which produces a structured monocrystalline silicon layer on glass:

a) A monocrystalline silicon substrate wafer receives a surface structure by any type of etching or mechanical grinding. In this respect structures are possible which are much more complicated than the regular inverted pyramids of the periodicity p in FIG. 1A.

b) The surface of the substrate is converted into a porous silicon layer (porous Si-layer, PSL) of the thickness $W_{PS}$. The orientation of the silicon in the PSL passes on the information concerning the substrate orientation.

c) Silicon is subsequently grown epitaxially onto the PSL. A low temperature epitaxial technique is of advantage, because the surface mobility of the silicon atoms at the inner surface of the PSL leads to a sintering process at temperatures above 850° C.

At this point in time the outer surface of the epitaxial layer is freely accessible. Every process which works at temperatures below about 850° C. can be used in order to form the emitter of the cell. Both an epitaxial emitter as well as an inversion layer or a heterojunction emitter are possible. For surface passivation and grid formation innovative techniques should be used.

d) An overlying substrate (for example glass) is secured with a transparent adhesive to the front surface. The temperature stability of the overlying substrate and of the adhesive determine the maximum process temperature of all subsequent process steps.

e) The low mechanical strength of the PSL in comparison to the substrate silicon is exploited in order to separate the cell from the substrate. A plurality of ways of proceeding is possible: shock heating, filling of the holes with liquids or gases which are caused to expand, straining of the PSL by compressive or tensile stress, or ultrasonic treatment. In all these cases the PSL functions as a perforation in silicon (Psi) hence the name φ.

f) the rear side of the cell is accessible for surface passivation and the formation of a reflector. An offset reflector can also serve to form point contacts, which are compatible with a low recombination of the minority charge carriers.

The free accessibility to the rear and front surface is an intrinsic advantage of the φ-process over processes which deposit silicon directly onto an insulating substrate.

The formation of the PSL consumes a thickness $W_{PS}$/Cos (α) of the substrate wafer which is so structured that the crystal surfaces stand at an angle α to the macroscopic cell surface. After the removal of the total remaining porous silicon, the substrate retains the original surface morphology (FIG. 1A) providing $W_{PS}/p \ll 1$. Otherwise the edges and tips are rounded with a gradius of curvature $W_{PS}/p$ as shown in FIG. 1E. Thus, the substrate can be reused several times for adequately small ratios $W_{PS}/p$ until a new structuring of the substrate wafer becomes necessary.

3. Experimental Investigations
3.1 Preparation of the Sample

A monocrystalline silicon wafer of the p+-type doped with boron to $10^{19}$ cm⁻³, orientated in the (100)-direction and of four-inch diameter, is given a structure of inverted pyramids with a periodicity p=13 µm by photolithography and anisotropic etching with KOH. Anodic etching in diluted HF produces a $W_{PS}$=6 µm thick porous silicon layer in a time of approximately 2 minutes. Prior to the epitaxy, the sample is heated for 10 minutes to ca. 850° C. in order to remove the naturally arising oxide from the PSL surface. An epitaxial Ga-doped silicon layer of a thickness of $W_{PS}$= 5,8 µm is grown by the ion-assisted deposition technique ((IAD) at 700° C. The growth rate amounts to 4 µm/h on planar surfaces. Transparent poly-(ethylene-phtalate) secures glass surfaces of the size 2×2 cm² to the epitaxial layer. An ultrasonic treatment of approximately 2 minutes destabilizes the PLS layer and facilitates the mechanical removal of the epitaxial layer without chemical etching. It is also possible to separate the epitaxial layer and the substrate from one another without the ultrasonic treatment.

3.2 Characterization of the Sample

FIGS. 2 and 4 show scanning electron microscope recordings of a freestanding silicon waffle structure which was produced with the φ-process. Apart from the ultrasonic treatment no further cleaning was effected before the scanning electron microscope investigations. The perspective plan view of FIG. 2 shows regular inverted pyramids which are copies of the original surface structure of the substrate wafer. FIG. 4 shows in oblique view the cross-section of the waffle structure. The pyramid tips point downwardly. No cracks can be seen. The layer thickness perpendicular to the pyramid-shaped crystal surfaces amounts to $W_f$=5.8 $\mu$m. The topside has non-visible recesses in FIGS. 2 and 4, the depth and diameter of which respectively amount to less than 0.1 $\mu$m, whereby a type of micro roughness is present. These recesses are associated with the IAD-technique, since they also occur with flat epitaxial layers which are grown on non-structured substrate silicon.

Hall measurements on a layer, which was deposited on a non-structured monocrystalline substrate of high specific resistance, show a concentration of the electrically active dopant material Ga of $2\times10^{17}$ cm$^{-3}$ and a hole mobility of 186 cm$^2$/Vs.

Figure 14:
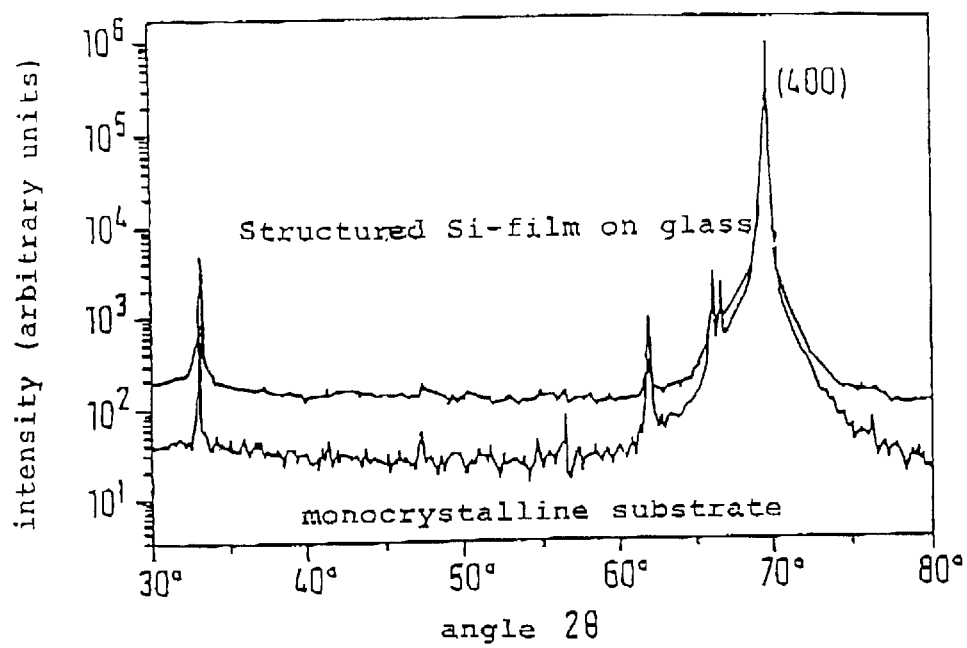
FIG. 14 is an X-ray diffraction spectra of the silicon "waffle" of FIG. 2 and of the monocrystalline substrate.

FIG. 14 shows the $Cu_{K_\alpha}$ X-ray diffraction spectrum of the silicon waffle on glass in comparison to the spectrum of the monocrystalline silicon substrate. The intensity is shown in the logarithmic scale. All peaks occur at the same angle. Thus, the silicon waffle structure is monocrystalline and has the same orientation as the substrate wafer. Only the large (400) peak originates from silicon. All other peaks are more than 2 orders of magnitude smaller and are artefacts of the X-ray apparatus. The high background intensity of the epitaxial layer is caused by the amorphous glass substrate. Consequently, the IAD technique enables the epitaxial growth on porous substrates.

The lifetime of the substrate minority charge carriers is one of the critical material parameters of a solar cell. The surface must be well passivated in order to measure the substrate lifetime. Accordingly, a freestanding silicon waffle is oxidized at 1000° C. on both sides. The surfaces are charged by a corona discharge chamber, in order to repel the minority charge carriers from the recombination centers at the surface.

Figure 15:
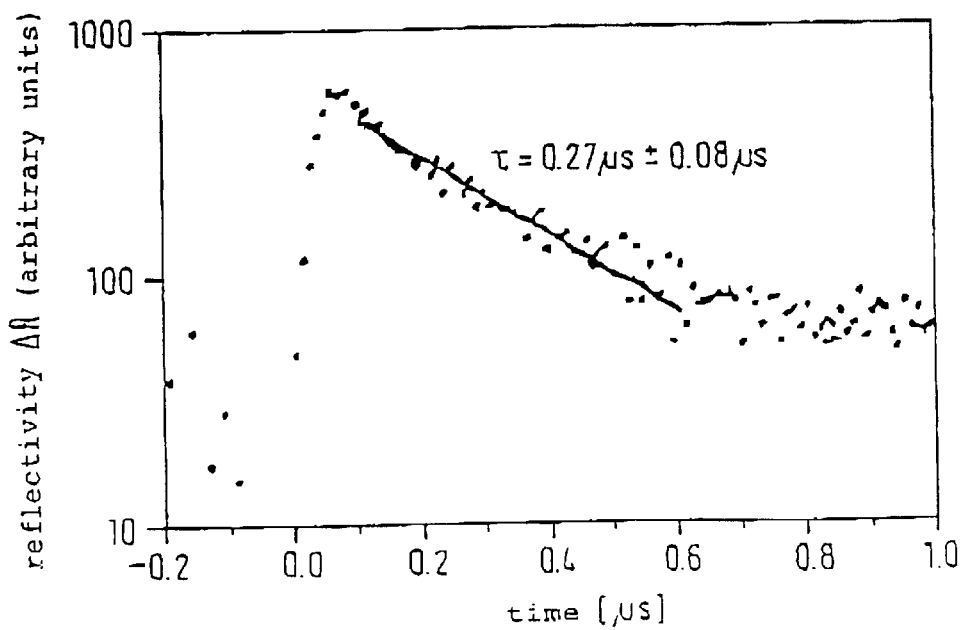
FIG. 15 illustrates transient microwave reflectivity ΔR of the Wf=5.8 μm thick Si "waffle" of FIG. 2 after optical excitation with a 20 ns laser pulse.

FIG. 15 shows the plot of the microwave reflectance after excitation with an optical pulse of 20 ns. The sample is arranged by quarter microwave wavelength above a metal reflector in order to achieve optimum sensitivity. The drop-off is not strictly monoexponential. It does, however, permit the lifetime to be estimated at $\tau$=0.27 $\mu$s±0.08 $\mu$s. The slow drop-off for times t>0.6 $\mu$s is caused by softening (de-trapping) of charge carriers in flat levels. The electron mobility was not measured. However, having regard to the measured hole mobility $\mu$=186 cm$^2$/Vs, a minority charge carrier diffusion length L>11 $\mu$m is calculated as the lower limit for the electron mobility and this is greater than the film thickness $W_f$=5.8 $\mu$m.

For thin film cells the light trapping is important. Unfortunately, the ideal behavior of the adhesively bonded waffle structure which is provided with an aluminum mirror behind the sample as schematically shown in FIG. 1F cannot be measured without contacting the sample. Accordingly, the short current potential of the sample was estimated from a comparison with a measured hemispherical reflectance and a ray following simulation with the program SUNRAYS. It was shown that the offset reflector substantially reduces the optical losses in the Al.

Figure 16:
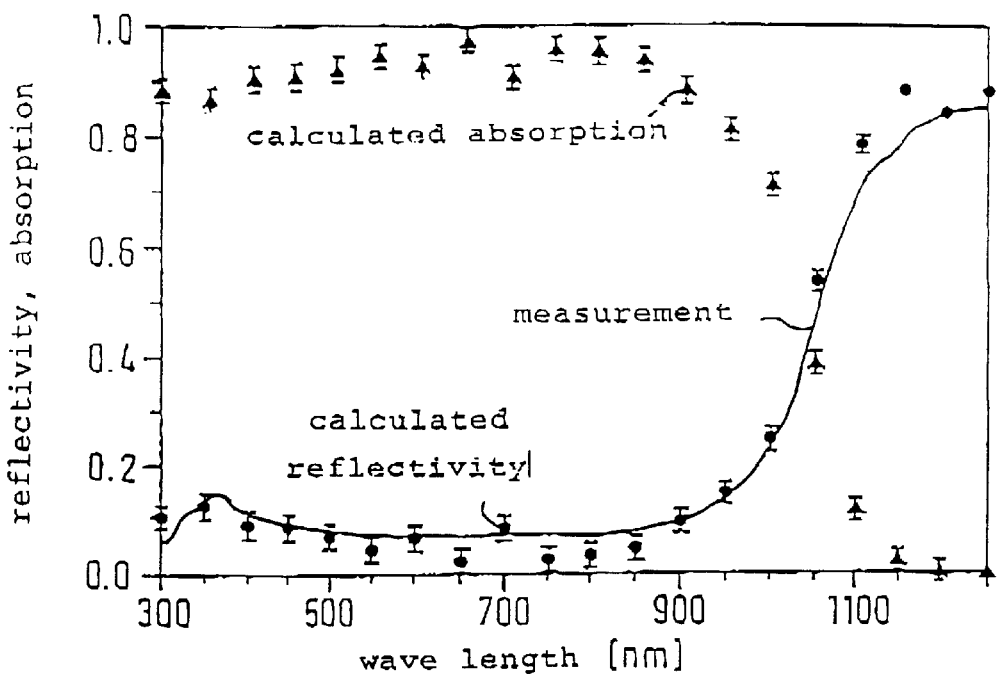
FIG. 16 illustrates the measured hemispherical reflectivity of the encapsulated waffle structure.

FIG. 16 shows the measured (continuous line) and the calculated (circle) hemispherical reflectance. The ray tracing simulation reproduces approximately the measurement without adaptation of the optical parameters. Small deviations between the measurement and the simulation are qualitatively explained by the microroughness of the pyramidal crystal surfaces, which were not taken into account in the simulation. SUNRAYS calculates a maximum short circuit current $j_{SC}$*=36.5 mA/cm$^2$±0.5 mA/cm$^2$ from the simulated absorption (triangles) for the $W_f$=5.8 $\mu$m thick waffle with a structure period p=13 $\mu$m on the radiation with an AM 1.5 G spectrum of 1000 W/m$^2$. The error bars result from the statistics of the Monte-Carlo-simulation.

4. Possible Efficiency

The possible efficiency of crystalline silicon layers with the form shown in FIGS. 2 and 4 is investigated by theoretical modelling. The optical model uses ray tracing by SUNRAYS, as described above. The rate of the minority charge carrier production is set to be spatially homogenous in the silicon layer and calculated from $j_{SC}$* and the cell volume. In addition to the optical model, a model for the electron transport is necessary. The complex three-dimensional charge carrier diffusion in the silicon waffle is approximated by a purely one-dimensional transport perpendicular to the pyramidal crystal surfaces. The efficiency of the cell depends on the minority charge carrier diffusion length L and the surface recombination velocity (SRV) S. It is very important to optimize the cell thickness $W_f$ in order to correctly estimate the possible efficiency for fixed L and S. Accordingly, the simulation varies the film thickness W for an ideal cell efficiency. A silicon cell is assumed with an emitter which is p-doped to $10^{19}$ cm$^{-3}$ and 0.5 $\mu$m thick and has a base which is B-doped $10^{18}$ cm$^{-3}$. For thick W<1 $\mu$m the base and the emitter are of the same thickness. The diffusion length L and the surface recombination speed S are equated for the base and the emitter in order to reduce the number of free parameters. The recombination in the space charge zone is explained in S. C. Choo, "Solid-St. Electron 39", 308 (1996), Eq. 3. The mobility values and parameters of the bandgap narrowing of c-silicon are taken from M. J. Stocks, A. Cuevas and A. W. Blakers, "Progress in Photovoltaics 4", 35 (1996).

Figure 17:
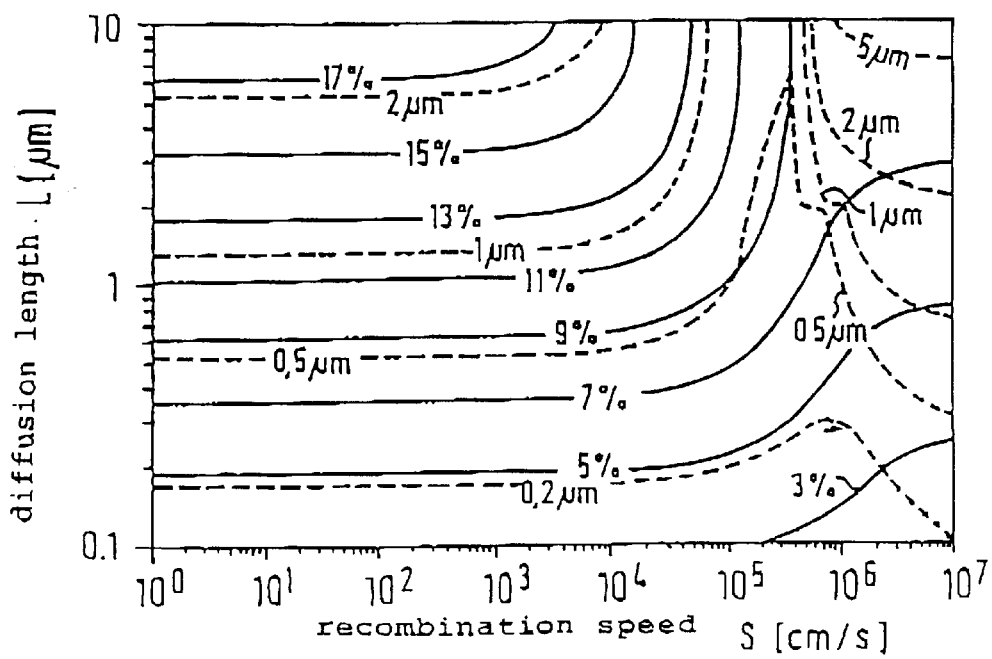
FIG. 17 illustrates the theoretical energy conversion efficiency (solid lines) and ideal cell thickness (broken lines) for solar cells with the waffle structure of FIG. 2, FIGS. 18, 19 are schematic illustrations similar to FIGS. 8 and 9, but with a modified embodiment.

FIG. 17 shows the efficiency (continuous line) for optimum cell thickness (broken line) for a broad range of the parameters S and L. With a diffusion length L=11 $\mu$m, an energy conversion efficiency of 16 to 19% is calculated in dependence on the surface recombination speed S for an ideal cell thickness of 2 to 3 $\mu$m (points). An efficiency of 16% corresponding to an SRV S=$10^4$ cm/s would be a great success for 2 $\mu$m thick crystal silicon solar cell on glass. The deposition of a $W_f$=2 $\mu$m thin layer requires 50 minutes with the currently used IAD technique.

The new process of perforated silicon (($\phi$-process) has been explained. The epitaxy on a structured monocrystalline silicon substrate and the mechanical separation of the epitaxial layer from the substrate result in ultrathin monocrystalline structured silicon layers on any type of glass. Measurements of reflection capability show an optical absorption which corresponds to a maximum short circuit current $j_{SC}$*=36.5 mA/cm$^2$. Theoretically, the material quality is sufficient for an efficiency of 16 to 19% at an ideal cell thickness which extends from $W_f$=2 to 3 $\mu$m.

Further possibilities of the $\phi$-process lie in the small thickness WPS<1 $\mu$m of the porous layer in order to reduce the material consumption and the enabling of frequent reusability of the substrate wafer. A further increase of the deposition rate is likewise possible. Ultrathin layers of 100 cm$^2$ size can be produced without problem.

A further, specially preferred embodiment of the invention is described in the following and is concerned with the manufacture of a solar cell. The method described here is not restricted to a photocell, but should rather be understood as a general manufacturing process. The motivation for this embodiment lies in the fact that a series connection of solar cells permits power extraction from the solar cell model at high voltages and small currents. Small currents reduce ohmic losses. The contact fingers on the solar cell front and rear side also have the purpose of reducing ohmic losses. With a suitable integrated series connection, the contact tracks can therefore be avoided.

The realization of such a series connection takes place through the use of shadow masks. Here, a series connection of the solar cells is already effected during the layer manufacture, i.e. the layers are selectively grown (at certain locations, but not at others). The position of the layer growth is controlled by the shadow mask. The shadow mask is preferably realized by tensioned wires.

An example of a series connection using the φ-process will be described in the following with reference to FIG. 21. One possibility of the layer deposition of porous material is the ion-assisted deposition technique (IAD). In the IAD technique the transport of the silicon atoms is very directed, as in the vapor deposition technique. This is exploited in accordance with the invention in order to produce an integrated series connection during the layer manufacture through the use of shadow masks.

Figure 21:
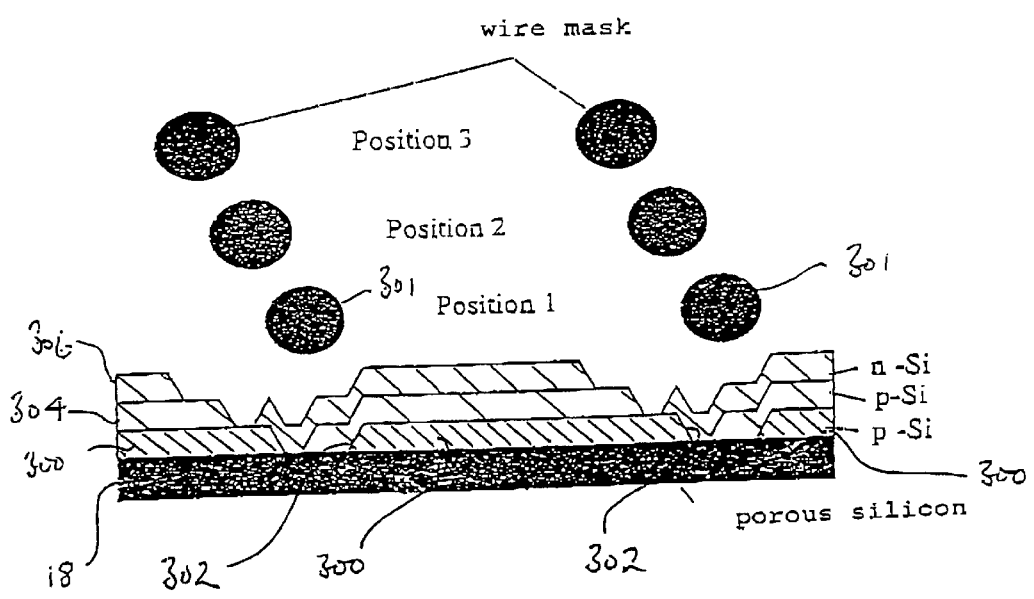
FIG. 21 is a schematic representation of the integrated connection through the use of a shadow mask, which is moved during the Ψ process into the positions 1 to 3, with the mask or the sample being shifted horizontally.

FIG. 21 shows the simple process sequence in a schematic illustration. The textured porous substrate 18, i.e. a structured substrate, which can be manufactured as previously described is shown for the sake of simplicity without texture. If the shadow mask 301 is located in the position 1, then individual regions 300 of the p+-Si-layer grow which are separated from one another by a trench 302. Thereafter, the same mask is shifted by a certain amount horizontally and individual regions of the p-Si-layer 304 grow. In the third position individual regions of the n+-Si-layer 306 are finally produced which then complete the series circuit by overlapping the exposed regions of the first p+-Si-layer. The definition of the surface areas of the individual layers in the direction transverse to the trenches of the individual layers 300, 304, 306, for example to the trenches 302, can be ensured by a further shadow mask, which does not have to be shifted, but which can optionally be shifted.

The advantages of this type of series connection are:

The application of metal contacts is omitted. The etching of the trenches is avoided. Both save process costs.

Only one mask is required; the accuracy of its shape is uncritical.

The application of wire grids is avoided.

If the wires are fixed outside of the hot region of the reactor, the wire spacing does not change during heating up. This avoids the known problems with the thermal expansion of large masks.

Shadow masks are coated during deposition and become unusable in the course of time. A wire mask can be easily renewed by rereeling wires in the reactor.

The most diverse modifications are possible, for example:

1. The sequence of the dopings can be exchanged, i.e. n+ at the bottom, p+ at the top.
2. Further layers come onto the emitter, such as for example metal layers or semitransparent metal oxide or layer systems of conductive and non-conductive layers to enhance the cross-conductivity of the emitter, all of which can be applied by shadow masks.
3. The wire diameter and the wire spacing can be varied from layer to layer.
4. The relative position of the wire mask and the sample, or the substrate, is continuously changed during the deposition of a layer.
5. The shadow mask consists not only of wires but rather of metal strips.
6. The principle of the shadow mask can also be used in order to produce semiconductor layers of any desired external shapes. If, for example, a mask with a circular opening is held in front of the porous Si-layer, then a round single crystal semiconductor layer arises which can be used as a solar cell in watches. A subsequent cutting of the semiconductor layer into the desired shape is avoided.

As mentioned in the introduction to the specification it can be difficult in the mass manufacture of electronic components using porous layers to carry out the mechanical separation as cleanly as is possible in the laboratory. This is to be attributed to the fact that the porous silicon has two functions. On the one hand, it permits the epitaxial, i.e. well-oriented, growth of a nonporous layer. The lower the porosity, the better this first function is satisfied. On the other hand, the silicon functions as a position of intended fracture for the mechanical separation. The higher the porosity, the better this second function is satisfied. A good quality and simultaneously releasable epitaxial layer therefore requires a balanced compromise between higher and lower porosity. Our experiments show that this compromise is frequently difficult to realize. Thus we have frequently observed that the epitaxial layers separate undesirably and uncontrollably during the subsequent epitaxial process. The methodology of EP-A-0 767 486 attempts to overcome this problem in that ions are implanted into the porous layer at a specific level or by changing the current density during the anodizing for the manufacture of the porous layer. In both cases, regions of the porous layer with higher porosity arise at which the mechanical separation preferentially takes place. These method variants are, however, relatively complicated and disadvantageous.

The ion implantation represents a further process step. The enhanced porosity in accordance with both method variants can lead to a fracture or to separation of the substrate at an undesired point in time, i.e. for example during the subsequent epitaxial process.

The following method variant described in conjunction with FIG. 22A to 22E provides assistance here:

The method comprises the following steps:

1) A reusable silicon substrate wafer is made porous wholly or close to the surface. On using an n-type wafer an additional illumination is necessary to make it porous by anodic etching. In the following, we assume the substrate wafer has been made fully porous. The porosity is low (greater than 0% and smaller than 50%, preferably 10 to 20%) in order to give the substrate wafer a high mechanical stability.

Figure 22A:
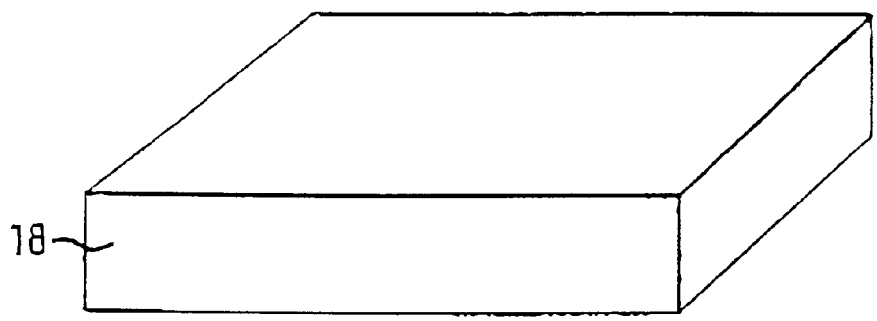
FIGS. 22A to 22E are sketches to explain a method in accordance with the invention for the separation of the layer-like structure from the substrate in the region of the boundary surface to the porous layer.
Figure 22B:
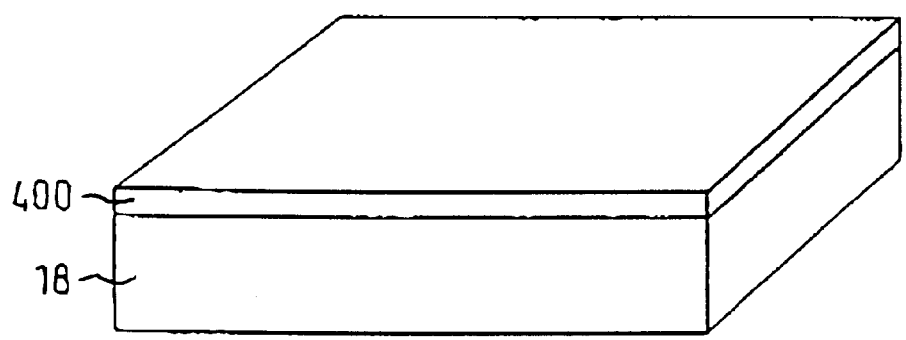
Figure 22C:
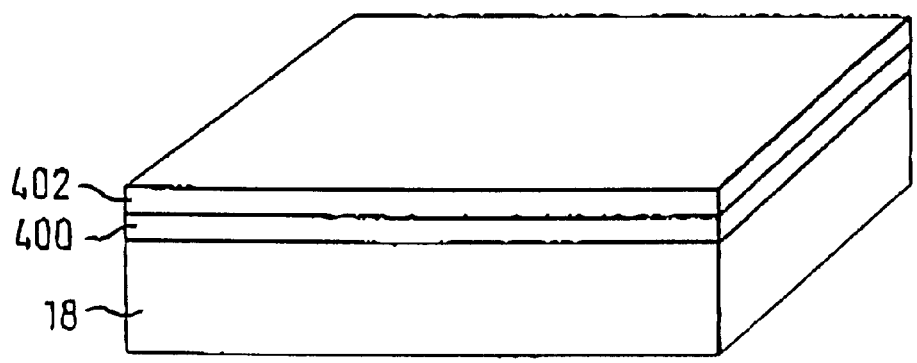

2) The mechanically stable low porosity substrate wafer 18 in FIG. 22A is shown here for the sake of simplicity with a planar surface, although a structured surface, as for example in FIG. 1, is preferred. Epitaxy is carried out on this substrate wafer 18 on the texturized or flat surface (for example an n-type Si-layer 400 is formed on it, as seen in FIG. 22B). The porous substrate endows the thin epitaxial layer with mechanical stability which permits a solar cell process to be carried out without the danger of undesired separation. The solar cell process can also include the deposition of a p-type epitaxial layer 402 onto the n-type epitaxial layer 400, as is for example shown in FIG. 22C.

Figure 22D:
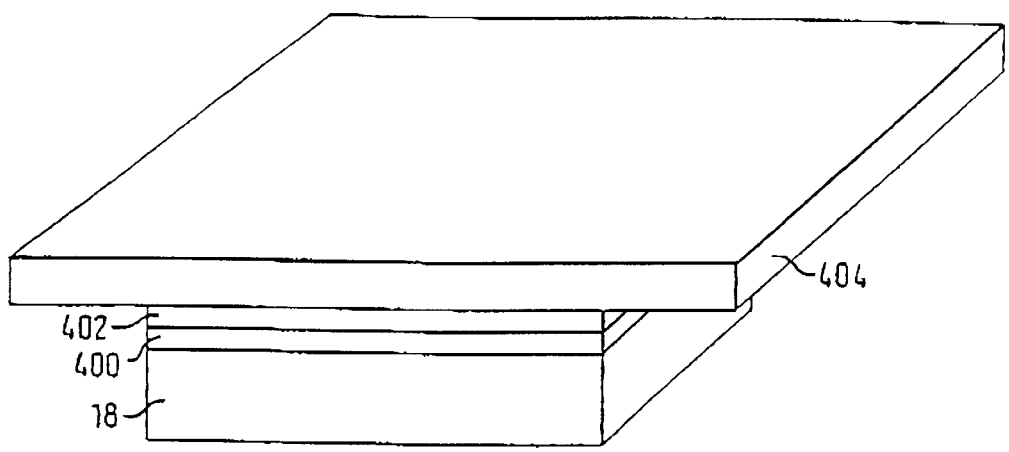

3) The solar cell is adhesively bonded onto a possibly transparent carrier 404, as shown in FIG. 22D. The porous substrate and the epitaxial layer or the solar cell which are fixedly connected together now bond onto the carrier. A mechanical separation from the porous substrate and the epitaxial layer is not possible because of the low porosity.

Figure 22E:
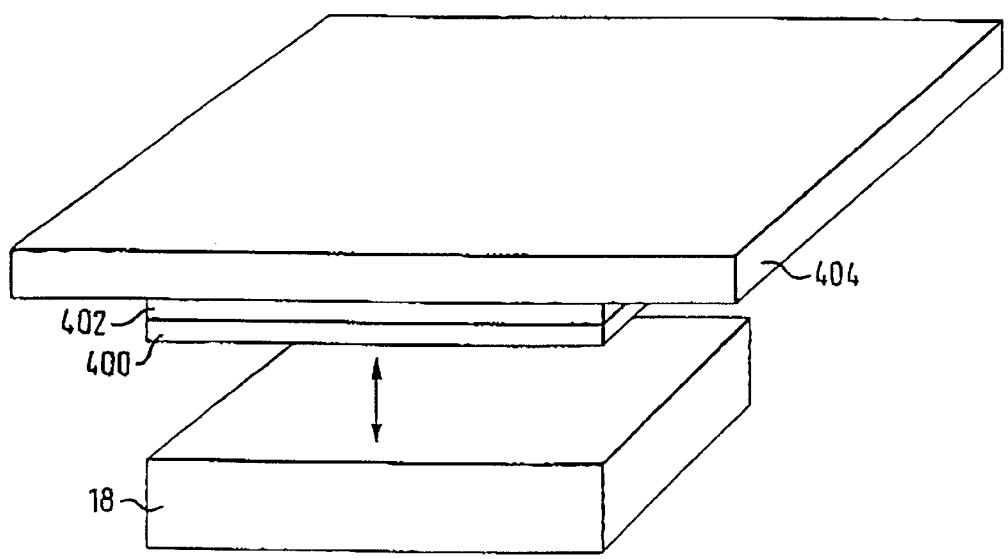

4) For the separation of the porous substrate from the epitaxial layer and the carrier, the total structure is again dipped into an etching solution containing HF. The solution penetrates through the porous substrate without etching it, because adequate holes must be made available for the etching process. Holes are now brought by means of illumination through the transparent carrier or by the application of an adequately large voltage between the electrolyte and the epitaxial layer to the boundary surface between the porous substrate and the epitaxial layer. If the hole concentration is sufficiently large, the boundary region is either made mechanically so unstable by producing further porosity that the epitaxial layer with the carrier can subsequently be separated from the substrate by mechanical loading, or the silicon is completely dissolved by a particularly high hole concentration (electro polishing) so that the epitaxial layers 400, 402 and the carrier separate from the porous substrate 18 (FIG. 22E). The carrier 404 with the two epitaxial layers, which preferably have the structuring in accordance with FIG. 8, or FIG. 18, or FIG. 20 or FIG. 21, can be completed via a reflector into a solar cell or can be treated further for the production of other components.

A high doping of the porous substrate wafer, for example a doping density in the range from $10^{18}$ to $10^{19}$ cm$^{-3}$, and also the large surface recombination in porous Si guarantee that the hole concentration has already dropped off by recombination in a depth of the porous substrate of 0.1 to 10 μm so that the greatest part of the porous substrate remains preserved and can be reused. In the event of a p-type epitaxial layer on a p-type porous substrate, the separation technique described here exploits the finding known per se that the current density selected during anodic etching only influences the porosity of the porous material newly arising at the boundary surface. If this porosity is selected close to 100%, then the epitaxial layer separates and the largest part of the porous substrate remains for reuse.

What is claimed is:

1. A method of manufacturing a layer-like structure in which a cavity exhibiting or porous layer is produced on a crystalline semiconductor substrate and wherein the layer-like structure is subsequently provided on the cavity exhibiting or porous layer and is subsequently separated from the substrate using the cavity exhibiting or porous layer as a position of intended separation, the surface of the substrate being structured prior to the generation of the cavity exhibiting or porous layer and the structure of the surface of the substrate being preserved after separation of said layer-like structure from the cavity exhibiting or porous layer.

2. A method in accordance with claim 1, wherein the crystalline semiconductor substrate comprises at least one material selected from a group of materials comprising: a monocrystalline p-type semiconductor, a monocrystalline n-type semiconductor, a polycrystalline p-type semiconductor, a polycrystalline n-type semiconductor, monocrystalline p-type silicon, monocrystalline n-type silicon, polycrystalline p-type silicon, and polycrystalline n-type silicon.

3. A method in accordance with claim 1, wherein the separation from the substrate using the cavity exhibiting or porous layer as a position of intended separation is performed by the generation of a mechanical strain within or at a boundary surface of the cavity exhibiting or porous layer.

4. A method in accordance with claim 3, wherein the generation of the mechanical strain acting within the cavity exhibiting or porous layer which leads to the separation of the layer-like structure, or of a part of it, from the substrate is produced by at least one of a group of methods comprising: lifting the layer-like structure from the substrate, an ultrasonic treatment, the generation of strong thermal gradients, for example by current flow through the porous layer or by illumination from one side, and expansion or change of state of a fluid or solvent filled into the pores of the cavity exhibiting or porous layer.

5. A method in accordance with claim 1, wherein if structuring the surface of the substrate prior to the generation of the cavity exhibiting or porous layer, it is structured by at least one method, selected from a group of methods comprising: by a photolithographic method, by an etch treatment, for example by a treatment of n- or p-silicon with KOH to produce random pyramids at the surface of the substrate, by a chemical method, by mechanical milling, and by laser treatment.

6. A method in accordance with claim 1, wherein if structuring the surface of the cavity exhibiting or porous layer, it is structured by at least one method, selected from a group of methods comprising: by a photolithographic method, by an etch treatment, for example by a treatment of n- or p-silicon with KOH to produce random pyramids at the surface of the substrate, by a chemical method, by mechanical milling, by laser treatment, and by mechanical coining.

7. A method in accordance with claim 1, wherein the layer-like structure comprises one or more layers applied onto the surface of the cavity exhibiting or porous layer at least partly by an epitaxial method (homo-epitaxy or hetero-epitaxy) with at least one semiconductor layer belonging to the layer-like structure being applied onto the surface of the cavity exhibiting or porous layer by the epitaxial method.

8. A method in accordance with claim 1, wherein the layer-like structure is formed at least partly by the application or deposition of a metal layer which is applied to the layer-like structure by heating and surface diffusion.

9. A method in accordance with claim 8 wherein the metal layer is in the form of one of an aluminum foil or an aluminum sheet.

10. A method in accordance with claim 1, wherein the step of forming the layer-like structure includes the application of a dielectric layer on an exposed surface of said layer-like structure.

11. A method in accordance with claim 10, wherein said dielectric layer is a light-permeable window layer, formed by a Sol-gel process.

12. A method in accordance with claim 10, wherein said dielectric layer is a light-permeable window layer, applied to said exposed surface by an adhesive.

13. A method in accordance with claim 1, wherein a carrier layer is provided which is brought into connection with the layer-like structure by one of wafer bonding, or a diffusion brazing method, or is formed as a part of the layer-like structure.

14. A method in accordance with claim 13 wherein the carrier layer is connected to the layer-like structure by an easy bonding.

15. A method in accordance with claim 1, wherein after the separation of the layer-like structure from the substrate, a further structure is produced on or applied to a surface of the layer-like structure previously disposed adjacent the substrate.

16. A method in accordance with claim 15, wherein said surface previously disposed adjacent the substrate is at least one of cleaned or partly removed or newly structured or made porous prior to the production of the further structure.

17. A method in accordance with claim 1, wherein after the separation of the layer-like structure from the substrate at a fracture surface, corresponding to said position of intended fracture, the substrate is used again, with or without the remainder of the cavity exhibiting or porous layer, as a substrate for the application of another layer-like structure.

18. A method in accordance with claim 17, wherein with renewed use of the substrate, the substrate is subjected to a cleaning step.

19. A method in accordance with claim 18 wherein the cleaning step is carried out by one of etching or an ultrasonic cleaning process at said fracture surface.

20. A method in accordance with claim 1, wherein a further porous layer is produced on the surface of the layer-like structure remote from the substrate prior to or after separation of the layer-like structure from the substrate, and a further layer-like structure is formed on said further porous layer, whereby a plurality of layer-like structures arise above one another, which are respectively separated from an adjacent layer-like structure by a porous layer forming a position of intended fracture, wherein, after producing such a multiple structure, the individual layer-like structures are separated from one another by the production of a mechanical strain within the respective porous layer or by an anodizing process at a boundary surface of the respective porous layer.

21. A method in accordance with claim 20, wherein after the separation of the individual layer-like structures, further structures are produced on at least one of free surfaces of the respective layer-like structure.

22. A method in accordance with claim 20, wherein prior to the separation of the individual layer-like structures from the multiple structure, the individual layer-like structures are respectively provided with a carrier layer or secured to a carrier.

23. A method in accordance with claim 20, wherein respective further structures are grown by epitaxial methods onto the surfaces of the so formed layer-like structures originally facing towards the substrate.

24. A method in accordance with claim 1, wherein the total structure is dipped into an etching solution containing HF for the separation of the layer-like structure from the substrate, the etching solution penetrates the cavity exhibiting or porous material and holes are made available, whereby the porosity is increased in the cavity exhibiting or porous layer for the separation of the layer-like structure from the substrate.

25. A method in accordance with claim 24, wherein the initial porosity amounts to 5 to 50%.

26. A method in accordance with claim 25 wherein the initial porosity amounts to 10 to 20%.

27. A method in accordance with claim 26 wherein the initial porosity is increased to 100% for the carrying out of the separation.

28. A method for the manufacture of a substrate comprising a carrier layer and a porous layer of silicon or of another semiconductor material provided thereon, wherein a cylindrical bar consisting of a single crystal semiconductor material is continuously treated at its surface to produce a porous surface layer, a jacket surface of the bar being dipped during a rotation about the cylinder axis into an HF bath and an electrical potential drop is produced with corresponding flow of current from the bar to an electrode arranged in the HF bath, while the porous surface layer which is produced is continuously drawn off from the bar by a carrier layer which is continuously applied to the porous surface, and a layer-like structure is subsequently grown onto the porous surface layer.

29. A method in accordance with claim 28, wherein the drawn off layer is brought into a tube shape and subsequently converted by an epitaxial method into a monocrystalline tube.

30. A method in accordance with claim 28 wherein the layer-like structure is subsequently grown onto the porous surface layer onto a free-surface of the drawn off porous surface layer opposite to the carrier layer.

31. A method of manufacturing layer-like structures in which a cavity exhibiting or porous layer is produced on or from a substrate, wherein an uppermost layer of the cavity exhibiting or porous layer, is melted, at least in places, and is subsequently caused to solidify for the production of a single crystal non-porous layer and the solidified layer is subsequently separated from the substrate using the cavity exhibiting or porous layer, as a position of intended separation, or at a boundary surface of the cavity exhibiting or porous layer.

32. A method in accordance with claim 31, wherein the substrate comprises at least one material selected from a group of materials comprising: a monocrystalline p-type semiconductor, a monocrystalline n-type semiconductor, a polycrystalline p-type semiconductor, a polycrystalline n-type semiconductor, monocrystalline p-type silicon, monocrystalline n-type silicon, polycrystalline p-type silicon, and polycrystalline n-type silicon.

33. A method in accordance with claim 31, wherein the melting of the uppermost layer of the cavity exhibiting or porous layer, or at least of places therein, is performed by at least one of a group comprising: a laser beam, an electron beam, and a focused light beam.

34. A method in accordance with claim 31, wherein a layer like structure is grown onto the surface of the solidified layer prior to the separation of the solidified layer from the substrate.

35. A method in accordance with claim 31, wherein the total structure is dipped into an etching solution containing HF for the separation of the solidified layer from the substrate, the etching solution penetrates the cavity exhibiting or porous material and holes are made available, whereby the porosity is increased in the cavity exhibiting or porous layer for the separation of the solidified layer from the substrate.

36. A method in accordance with claim 35, wherein the initial porosity amounts to 5 to 50%.

37. A method in accordance with claim 36 wherein the initial porosity amounts to 10 to 20%.

38. A method in accordance with claim 37 wherein the initial porosity is increased to 100% for the carrying out of the separation.

39. A method in accordance with claim 31 wherein the production of a single crystal non-porous layer and the solidified layer is subsequently separated from the substrate using the cavity exhibiting or porous layer, as a position of independent separation, by the production of a mechanical strain within the cavity exhibiting or porous layer.

40. A method of producing a semiconductor circuit, using a method of manufacturing a layer-like structure in which a cavity exhibiting or porous layer is produced on a crystalline semiconductor substrate and wherein the layer-like structure is subsequently provided on the cavity exhibiting or porous layer and is subsequently separated from the substrate using the cavity exhibiting or porous layer as a position of intended separation, the surface of the substrate being structured prior to the generation of the cavity exhibiting or porous layer and the structure of the surface of the substrate being preserved after separation of said layer-like structure from the cavity exhibiting or porous layer wherein a shadow mask is arranged in front of the substrate during the manufacture of the layer-like structure and transverse to the transport direction of the atoms to be deposited and is used to control the growth of the layer-like structure.

41. A method in accordance with claim 40, wherein during the growth of a layer of the layer-like structure or between the growth of individual layers of the layer-like structure, a relative displacement is effected between the shadow mask and the substrate, in a first step, in a first position of the shadow mask, to produce a first layer with a trench between layer regions of a first conduction type and, in a subsequent step, in a further position of the shadow mask, to produce a second layer with an overlap between an edge region of a further layer of another conduction type and an exposed edge region of the layer of the first conductive type present adjacent to the trench, whereby the series connection is produced between two edge regions.

42. A method in accordance with claim 41 wherein the relative displacement is effected between the shadow mask and the substrate in parallel to the substrate.

43. A method in accordance with claim 41 wherein the two etch regions are two semiconductor elements formed by the layers on both sides of the trench.

44. A method in accordance with claim 40, wherein the shadow mask is formed from wires of any desired cross-sectional shape, the shadow mask is moved, from one side of the substrate to the other, in order to position new wire lengths forming the shadow mask in front of the substrate during the move.

45. A method in accordance with claim 44 wherein the shadow mask is periodically moved.

46. A method of manufacturing a substrate for semiconductor epitaxy, wherein a cavity exhibiting or porous layer is generated out of or applied onto a first substrate, a second substrate is applied onto a free surface of the cavity exhibiting or porous layer and subsequently separates the second substrate from the first substrate using the cavity exhibiting or porous layer as a position of intended fracture by the production of a mechanical strain such that a layer or sections of the cavity exhibiting or porous layer remains or remain adhered to the second substrate, whereby the second substrate can be used for epitaxial methods, wherein the first substrate or the cavity exhibiting or porous layer is structured prior to the separation of the second substrate from the first substrate, wherein the layer or sections of the cavity exhibiting or porous layer adhered to the second substrate is further prepared to form regions of porous material and regions which are free of porous material on said surface.

47. A method, in particular in accordance with claim 46, wherein said surface of said second substrate comprising regions of the cavity exhibiting or porous material is covered with a layer of amorphous silicon and the amorphous silicon is converted by a subsequent thermal treatment at positions where it covers said regions of cavity exhibiting or porous material into monocrystalline silicon, so that a desired pattern of amorphous silicon and monocrystalline silicon is present on the second substrate.

48. A method of manufacturing a substrate for semiconductor epitaxy, wherein a cavity exhibiting or porous layer is generated out of or applied onto a first substrate, a second substrate is applied onto a free surface of the cavity exhibiting or porous layer and subsequently separates the second substrate from the first substrate using the cavity exhibiting or porous layer as a position of intended fracture by the production of a mechanical strain such that a layer or sections of the cavity exhibiting or porous layer remains or remain adhered to the second substrate, whereby the second substrate can be used for epitaxial methods, wherein the total structure is dipped into an etching solution containing HF for the separation of the second substrate from the first substrate, the etching solution penetrates the cavity exhibiting or porous material and holes are made available, whereby the porosity is increased in the cavity exhibiting or porous layer for the separation of the second substrate from the first substrate.

49. Method in accordance with claim 48, wherein the initial porosity amounts to 5 to 50%.

50. A method in accordance with claim 49, wherein the initial porosity amounts to 10 to 20%.

51. A method in accordance with claim 50, wherein the initial porosity is increased to 100% for the carrying out of the separation.

* * * * *